(12) United States Patent
Kosugi et al.

(10) Patent No.: US 6,815,747 B2
(45) Date of Patent: Nov. 9, 2004

(54) SEMICONDUCTOR DEVICE COMPRISING CAPACITOR

(75) Inventors: Takeshi Kosugi, Hyogo (JP); Toshiyuki Oashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/315,029

(22) Filed: Dec. 10, 2002

(65) Prior Publication Data

US 2003/0227085 A1 Dec. 11, 2003

(30) Foreign Application Priority Data

Jun. 6, 2002 (JP) ........................................ 2002-165548

(51) Int. Cl.[7] ...................... H01L 27/108; H01L 29/76; H01L 29/94; H01L 31/119
(52) U.S. Cl. ...................... 257/296; 257/300; 438/239
(58) Field of Search ........................ 438/239; 257/296, 257/300

(56) References Cited

U.S. PATENT DOCUMENTS

| | | | |
|---|---|---|---|
| 5,920,761 A | 7/1999 | Jeon | |
| 6,150,206 A | 11/2000 | Oh | |
| 6,333,221 B1 | 12/2001 | Lee | |
| 6,656,821 B2 * | 12/2003 | Kweon | ........................ 438/460 |
| 2001/0001211 A1 * | 5/2001 | Tanaka et al. | ............... 257/309 |
| 2001/0009282 A1 * | 7/2001 | Kuroiwa et al. | ............. 257/303 |
| 2002/0003280 A1 * | 1/2002 | Kohyama | .................... 257/529 |
| 2003/0175425 A1 * | 9/2003 | Tatsumi | ................. 427/255.28 |

FOREIGN PATENT DOCUMENTS

| | | |
|---|---|---|
| DE | 196 20 833 A1 | 5/1996 |
| EP | 1 146 556 A1 | 10/2001 |
| JP | 10-22453 | 1/1998 |
| JP | P2001-274340 A | 10/2001 |

* cited by examiner

*Primary Examiner*—Long Pham
(74) *Attorney, Agent, or Firm*—McDermott Will & Emery LLP

(57) ABSTRACT

A conductive film forming a capacitor lower electrode has portions extending perpendicularly to the main surface of a semiconductor substrate and a portion extending in parallel with the main surface of the semiconductor substrate. An insulator film forming a capacitor dielectric film is provided along the surface of a recess portion defined by the conductive film. Another conductive film forming a capacitor upper electrode is embedded in a recess portion of the insulator film. The conductive film and a wiring layer are formed on the same layer, so that the wiring layer functions as a dummy pattern of a capacitor having the conductive films. Consequently, a semiconductor device having a capacitor capable of increasing the electrostatic capacitance and reducing the quantity of the material forming the dummy pattern without occupying a large area in the direction parallel to the main surface of the semiconductor substrate is obtained.

8 Claims, 43 Drawing Sheets

SEMICONDUCTOR DEVICE COMPRISING CAPACITOR

BACKGROUND OF THE INVENTION

1. Field of the Invention

The present invention relates to a semiconductor device comprising a capacitor.

2. Description of the Background Art

In a conventional semiconductor device such as a DRAM (dynamic random access memory), a capacitor is generally provided on an interlayer dielectric film formed on a semiconductor substrate.

A conventional semiconductor device having a capacitor is now described with reference to FIG. 43.

In the conventional semiconductor device having a capacitor, two transistors 101 and 102 are formed inside element forming regions enclosed with element isolation films on a semiconductor substrate 100. A vertically extending wire is connected to a source/drain region of the transistor 101. Another vertically extending wire is connected also to a source/drain region of the transistor 102.

A plurality of interlayer dielectric films 113, 1100 and 1200 are formed above the transistors 101 and 102 in a stacked manner. A via plug 114 is embedded above the transistor 101 in the interlayer dielectric film 113 included in the plurality of interlayer dielectric films 113, 1100 and 1200.

Further, a capacitor lower electrode 115 is embedded in the interlayer dielectric film 113. This capacitor lower electrode 115 is connected to the upper surface of the via plug 114. A wiring layer 165 of the same layer as the capacitor lower electrode 115 located above the transistor 101 is embedded above the transistor 102. The capacitor lower electrode 115 and the wiring layer 165 are flush with each other with reference to the main surface of the semiconductor substrate 100. A wiring layer 1165 of the same layer as a capacitor upper electrode 1015 is embedded above the wiring layer 165. The capacitor upper electrode 1015 and the wiring layer 1165 are flush with each other with reference to the main surface of the semiconductor substrate 100.

In the semiconductor device shown in FIG. 43 having the aforementioned structure, the interlayer dielectric film 1100 is formed above the transistors 101 and 102, in order to form the capacitor above the transistor 101. Further, the capacitor upper electrode 1015 is formed on an upper portion of the interlayer dielectric film 1100 located above the transistor 101. The capacitor lower electrode 115 and the capacitor upper electrode 1015 form the capacitor connected to the source/drain region of the transistor 101.

The interlayer dielectric film 1200 covering the interlayer dielectric film 1100 and the capacitor upper electrode 1015 is formed above the transistors 101 and 102 respectively. The interlayer dielectric film 1200 is an insulator film for filling up holes in a region other than that shown in FIG. 43, for example.

In the aforementioned semiconductor device shown in FIG. 43, the wiring layers 165 and 1165 are provided as dummy patterns corresponding to the capacitor lower electrode 115 and the capacitor upper electrode 1015 respectively. A large number of such wiring layers 165 and 1165 serving as dummy patterns are provided on the same level as the capacitor at substantially regular intervals in a direction parallel to the main surface of the semiconductor substrate 100. In a CMP (Chemical Mechanical Polishing) step after formation of the capacitor, therefore, surface uniformity of the interlayer dielectric film 1200 is ensured after polishing.

In the aforementioned semiconductor device shown in FIG. 43, a large number of wiring layers 165 and 1165 serving as dummy patterns must be provided substantially at regular intervals in the direction parallel to the main surface of the semiconductor substrate 100, in order to provide the capacitor. Therefore, the quantity of the material forming the dummy patterns is disadvantageously increased.

In the semiconductor device such as a DRAM, the capacitance of the capacitor is to be increased. In order to increase the capacitance of the capacitor, the opposite area of the capacitor upper electrode 1015 and the capacitor lower electrode 115 must be increased. Therefore, the sizes of the capacitor upper electrode 1015 and the capacitor lower electrode 115 may conceivably be increased in the direction parallel to the main surface of the semiconductor substrate 100. When the size of the capacitor is increased in the direction parallel to the main surface of the semiconductor substrate 100, however, it is difficult to refine the semiconductor device.

SUMMARY OF THE INVENTION

An object of the present invention is to provide a semiconductor device capable of attaining both of an effect of increasing the electrostatic capacitance of a capacitor and an effect of reducing the quantity of a material forming a dummy pattern corresponding to the capacitor without increasing the size of the capacitor in a direction parallel to the main surface of a semiconductor substrate.

A semiconductor device according to a first aspect of the present invention comprises a semiconductor substrate, an interlayer dielectric film having an upper surface parallel to the main surface of the semiconductor substrate and including a first recess portion formed at a prescribed depth from the upper surface and a second recess portion formed at a prescribed depth from the upper surface, and a first conductive film, filling up the first recess portion, having an upper surface continuous with the upper surface.

The semiconductor device according to the first aspect of the present invention further comprises a capacitor lower electrode provided along the surface of the second recess portion, a capacitor dielectric film provided along the surface of a recess portion defined by the capacitor lower electrode and a capacitor upper electrode provided in a recess portion defined by the capacitor dielectric film.

According to the aforementioned structure of the inventive semiconductor device, both of an effect capable of increasing the electrostatic capacitance of a capacitor and an effect capable of reducing the quantity of a material forming a dummy pattern corresponding to the capacitor can be attained without increasing the size of the capacitor in the direction parallel to the main surface of the semiconductor substrate.

A semiconductor device according to a second aspect of the present invention comprises an element forming region, formed on a semiconductor substrate, provided with a transistor, an element isolation film, enclosing the element forming region, having a recess portion formed at a prescribed depth from the upper surface and a capacitor provided in the recess portion and electrically connected to a source/drain region of the transistor.

According to the aforementioned structure of the inventive semiconductor device, both of an effect capable of increasing the electrostatic capacitance of the capacitor and an effect capable of reducing the quantity of a material forming a dummy pattern corresponding to the capacitor can be attained without increasing the size of the capacitor in a direction parallel to the main surface of the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of a semiconductor device according to the present invention and a method of fabricating the same are now described with reference to FIGS. 1 to 42.

First Embodiment

The structure of a semiconductor device according to a first embodiment of the present invention and a method of fabricating the same are described with reference to FIGS. 1 to 10.

Figure 1:
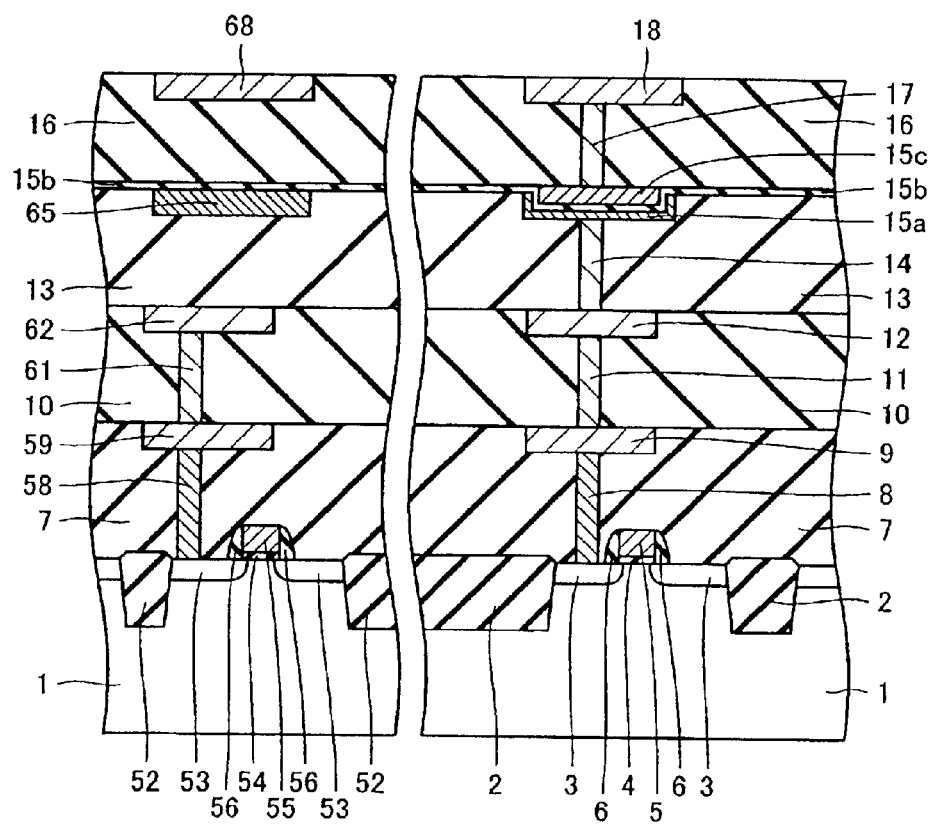
FIG. 1 is a sectional view showing the structure of a semiconductor device according to a first embodiment of the present invention.

As shown in FIG. 1, the semiconductor device according to the first embodiment has the following structure:

Element isolation films 2 for isolating element forming regions from each other are formed at a prescribed depth from the main surface of a semiconductor substrate 1. Source/drain regions 3 and 53 are formed on the element forming regions at a prescribed depth from the main surface of the semiconductor substrate 1.

A gate insulator film 4 is formed on a region located between the source/drain regions 3. A gate electrode 5 is formed on the gate insulator film 4. Side wall insulator films 6 are formed on the side walls of the gate insulator film 4 and the gate electrode 5.

A gate insulator film 54 is formed between the source/drain regions 53. A gate electrode 55 is formed on the gate insulator film 54. Side wall insulator films 56 are formed on the side walls of the gate insulator film 54 and the gate electrode 55.

An interlayer dielectric film 7 is formed to cover the upper surfaces of transistors and the element isolation films 2. A contact plug 8 vertically passing through the interlayer dielectric film 7 is formed to be connected to one of the source/drain regions 3. Another contact plug 58 vertically passing through the interlayer dielectric film 7 is formed to be connected to one of the source/drain regions 53. A wiring layer 9 is connected to the upper surface of the contact plug 8. Another wiring layer 59 is also connected to the upper surface of the contact plug 58.

An interlayer dielectric film 10 is formed on the interlayer dielectric film 7 and the wiring layers 9 and 59. A via plug 11 vertically passing through the interlayer dielectric film 10 is connected to the wiring layer 9. Another via plug 61 vertically passing through the interlayer dielectric film 10 is also connected to the wiring layer 59. A wiring layer 12 is connected to the upper surface of the via plug 11. Another wiring layer 62 is also connected to the upper surface of the via plug 61.

Further, an interlayer dielectric film 13 is formed to cover the interlayer dielectric film 10 and the wiring layers 12 and 62. A first recess portion is provided on an upper portion of the interlayer dielectric film 13 above the gate electrode 55. A wiring layer 65 is embedded in the first recess portion. A second recess portion is provided on another upper portion of the interlayer dielectric film 13 above the gate electrode 5. A conductive film 15a forming a capacitor lower electrode is provided along the surfaces of the second recess portion. The wiring layer 65 and the interlayer dielectric film 13 are so formed that the upper surfaces thereof are continuous with each other and flush with each other with reference to the main surface of the semiconductor substrate 1.

An insulator film 15b is formed to cover the upper surfaces of the interlayer dielectric film 13, the conductive film 15a and the wiring layer 65 respectively. This insulator film 15b forms a dielectric film of the capacitor. A conductive film 15c forming a capacitor upper electrode is embedded in a recess portion defined by the surfaces of the insulator film 15b. The upper surfaces of the insulator film 15b and the conductive film 15c are flush with each other with reference to the main surface of the semiconductor substrate 1, and substantially parallel to main surface of the semiconductor substrate 1.

In addition, an interlayer dielectric film 16 is formed to cover the insulator film 15b and the conductive film 15c. A via plug 17 vertically passing through the interlayer dielectric film 16 is connected to the conductive film 15c. A wiring layer 18 is embedded in an upper portion of the interlayer dielectric film 16. This wiring layer 18 is connected to the upper surface of the via plug 17. Another wiring layer 68 formed by the same layer as the wiring layer 18 is embedded in another upper portion of the interlayer dielectric film 16.

In the aforementioned semiconductor device having the structure shown in FIG. 1, the conductive film 15a forming the capacitor lower electrode has two side surface portions extending perpendicularly to the main surface of the semiconductor substrate 1 and a bottom surface portion provided between the side surface portions to extend in parallel with the main surface of the semiconductor substrate 1.

Therefore, the insulator film 15b formed along the recess portion defined by the conductive film 15a also has side surface portions extending perpendicularly to the main surface of the semiconductor substrate 1 on both ends thereof and a bottom surface portion extending in parallel with the main surface of the semiconductor substrate 1. Thus, the contact area between the capacitor dielectric film and the capacitor lower electrode is larger than that in the conventional semiconductor device described with reference to FIG. 43.

Therefore, the semiconductor device according to this embodiment can increase the capacitance of the capacitor without increasing the area thereof in the direction parallel to the main surface of the semiconductor substrate 1, dissimilarly to the conventional semiconductor device.

In the semiconductor device having the structure shown in FIG. 1, the conductive film 15c corresponding to the capacitor upper electrode is provided in the recess portion defined by the insulator film 15b corresponding to the capacitor dielectric film. Therefore, the height of the capacitor can be reduced as compared with the conventional capacitor. Consequently, the height of the wiring layer 65 formed as a dummy pattern corresponding to the capacitor can be reduced while increasing the capacitance of the capacitor. Thus, the height of the dummy pattern corresponding to the capacitor can be so reduced as to reduce the quantity of the material forming the dummy pattern.

Therefore, the semiconductor device having the structure shown in FIG. 1 can attain both of an effect capable of increasing the electrostatic capacitance of the capacitor and an effect capable of reducing the quantity of the material forming the dummy pattern corresponding to the capacitor without increasing the size of the capacitor in the direction parallel to the main surface of the semiconductor substrate 1.

A method of fabricating the semiconductor device provided with a capacitor having the structure shown in FIG. 1 is now described with reference to FIGS. 2 to 10.

Figure 2:
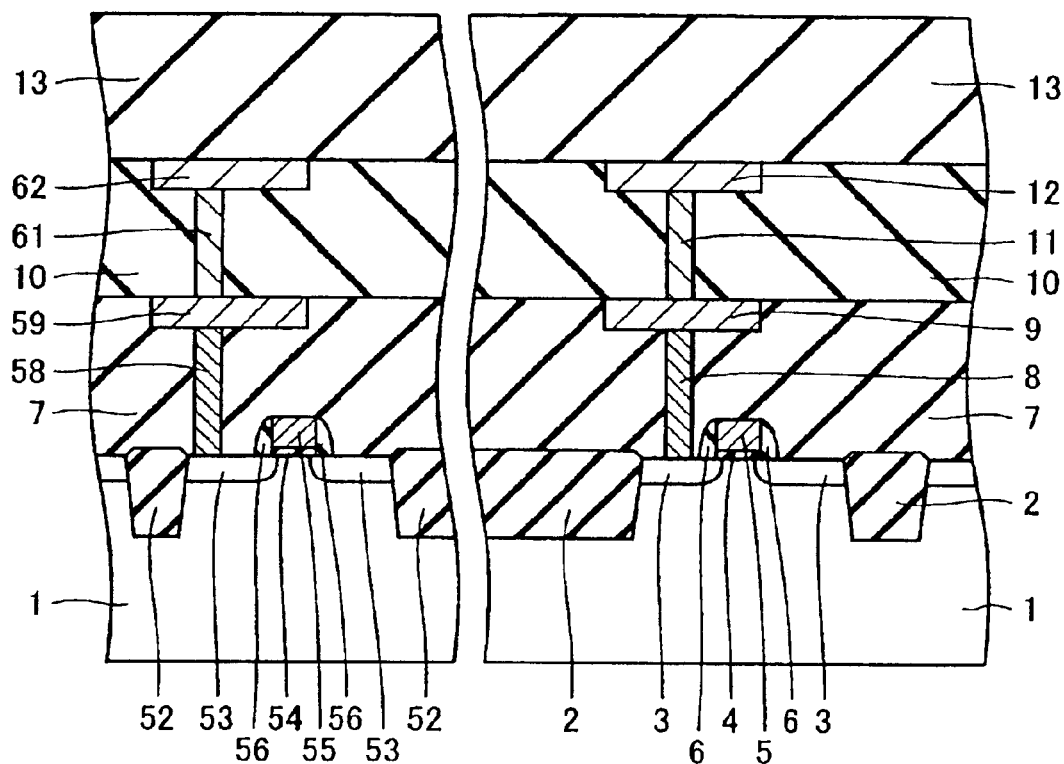
FIGS. 2 to 10 are diagrams for illustrating a method of fabricating the semiconductor device according to the first embodiment of the present invention.

In the method of fabricating the semiconductor device according to this embodiment, steps up to those of forming the wiring layers 12 and 62 are similar to those of a conventional method. Then, the interlayer dielectric film 13 is formed upon formation of the interlayer dielectric film 10 and the wiring layers 12 and 62 in the method of fabricating the semiconductor device according to this embodiment, as shown in FIG. 2. The upper surface of the interlayer dielectric film 13 is parallel to the main surface of the semiconductor substrate 1.

Figure 3:
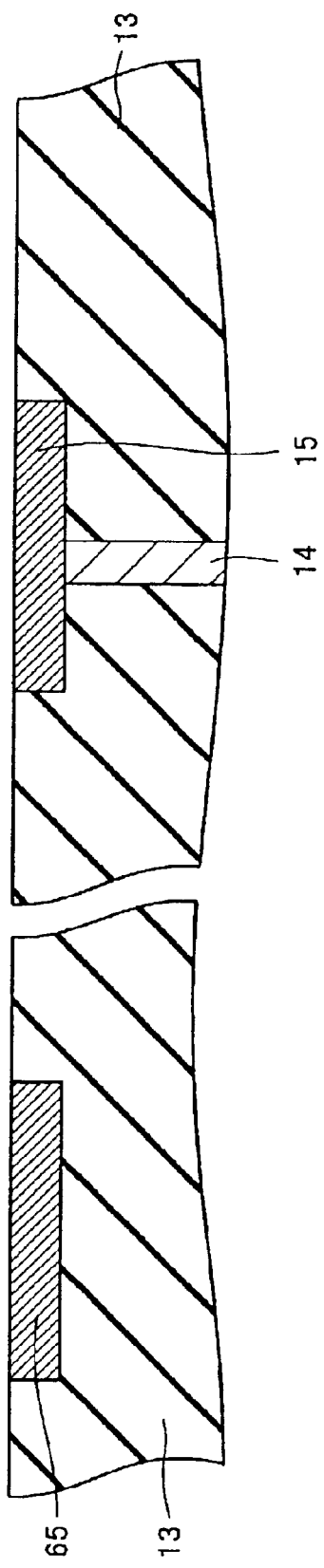

Then, the via plug 14 connected to the wiring layer 9 is formed vertically through the interlayer dielectric film 13, as shown in FIG. 3. Thereafter a conductive film 15 is formed to be connected to the upper surface of the via plug 14. The wiring layer 65 is formed on the same layer as the conductive film 15. At this point of time, the upper surfaces of the interlayer dielectric film 13, the conductive film 15 and the wiring layer 65 are continuous with each other and parallel to the main surface of the semiconductor substrate 1.

Figure 4:
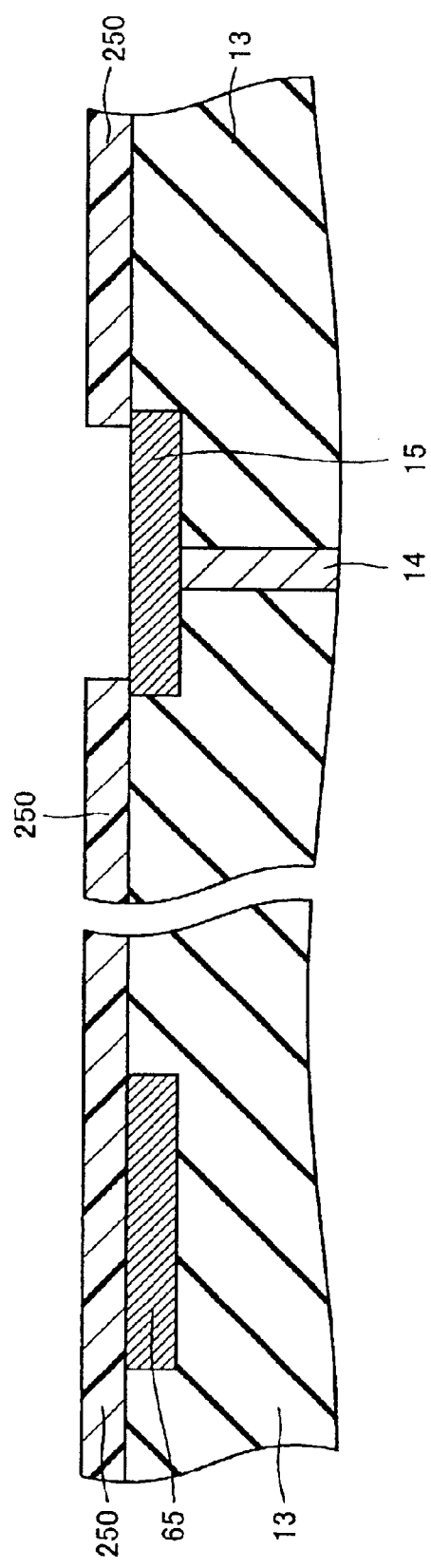
Figure 5:
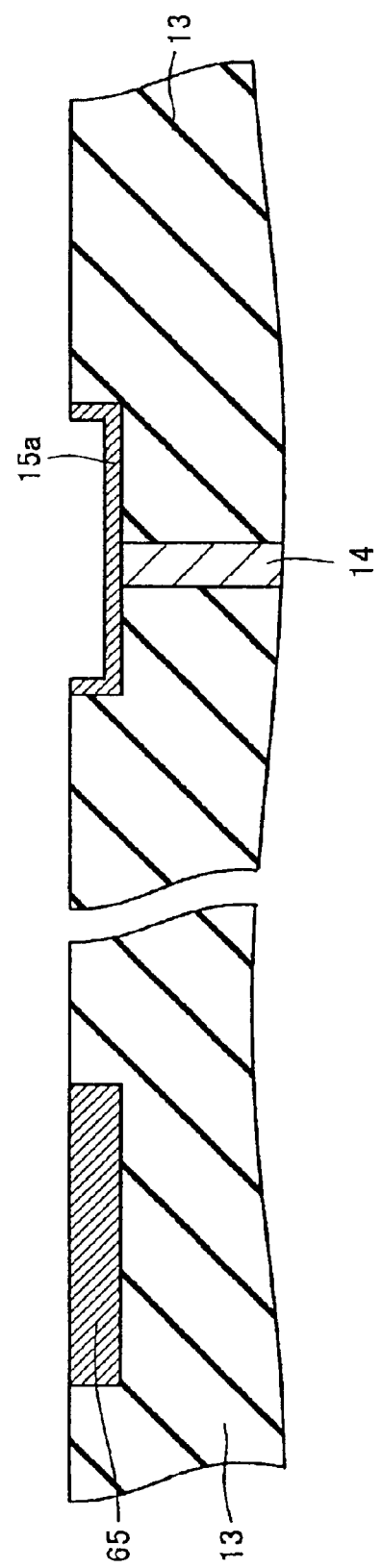

Then, a resist film 250 is formed to cover the upper surfaces of portions of the conductive film 15 located outside positions of prescribed distances from both ends of the conductive film 15 as well as the surfaces of the interlayer dielectric film 13 and the wiring layer 65, as shown in FIG. 4. The resist film 250 is employed as a mask for etching the conductive film 15, thereby forming the conductive film 15a forming the capacitor lower electrode as shown in FIG. 5. When the width of the conductive film 15a shown in FIG. 5 is identical to the width of the conventional capacitor lower electrode 115 shown in FIG. 43, the surface area of the recess portion defined by the surfaces of the conductive film 15a is larger than the surface area of the upper surface of the conventional capacitor lower electrode 115 shown in FIG. 43.

Figure 6:
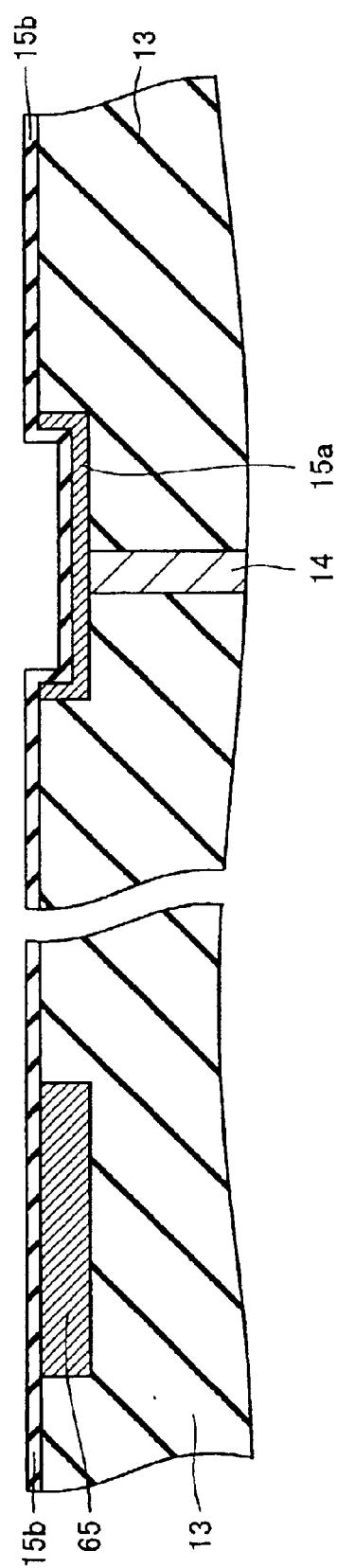
Figure 43:
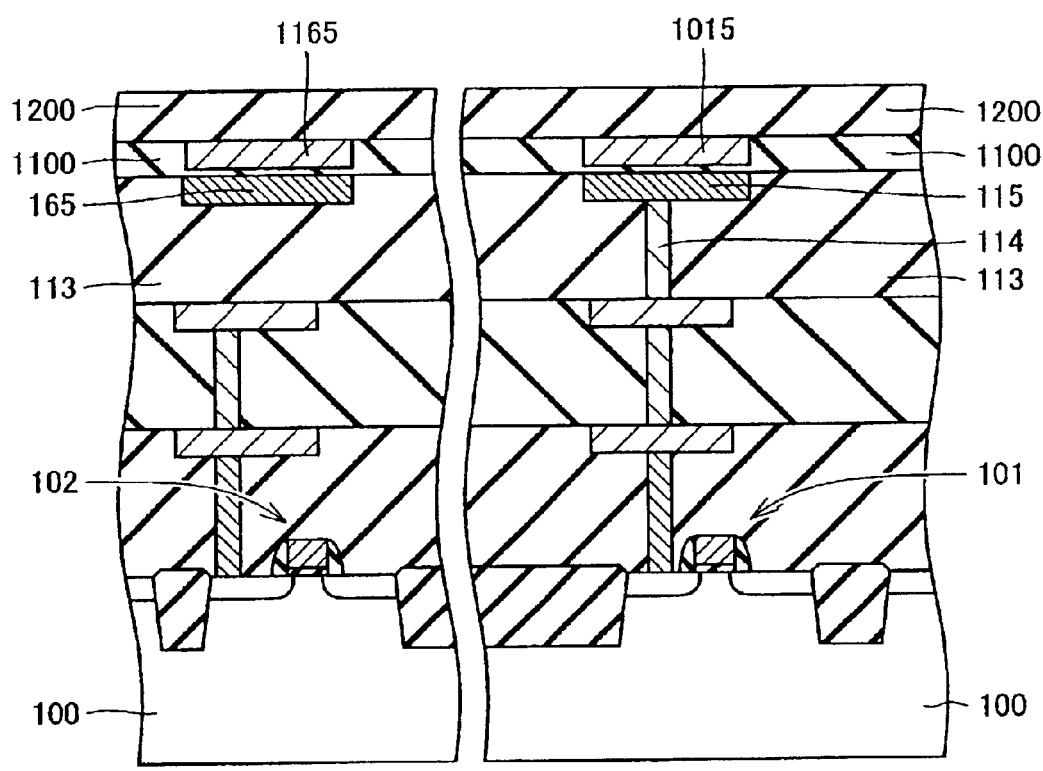
FIG. 43 is a diagram for illustrating a conventional semiconductor device.

Then, the insulator film 15b is formed along the upper surface of the interlayer dielectric film 13, the upper surface of the wiring layer 65 and the surfaces of the conductive film 15a, as shown in FIG. 6. Therefore, the area of the portion where the insulator film 15b and the conductive film 15a are in contact with each other is larger than the area of the portion where the upper surface of the capacitor lower electrode 115 and a capacitor dielectric film of the conventional semiconductor device shown in FIG. 43 are in contact with each other.

Figure 7:
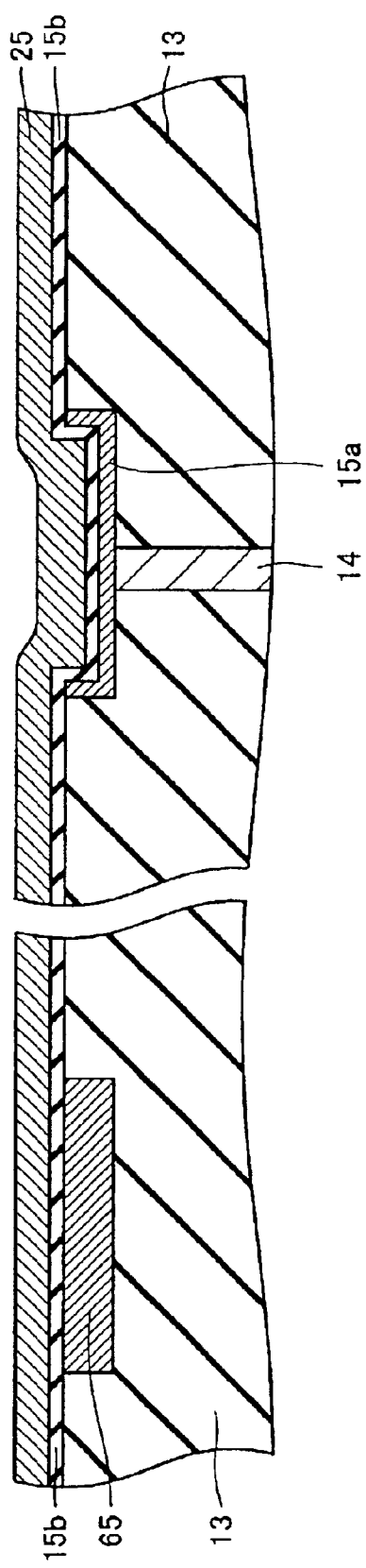
Figure 8:
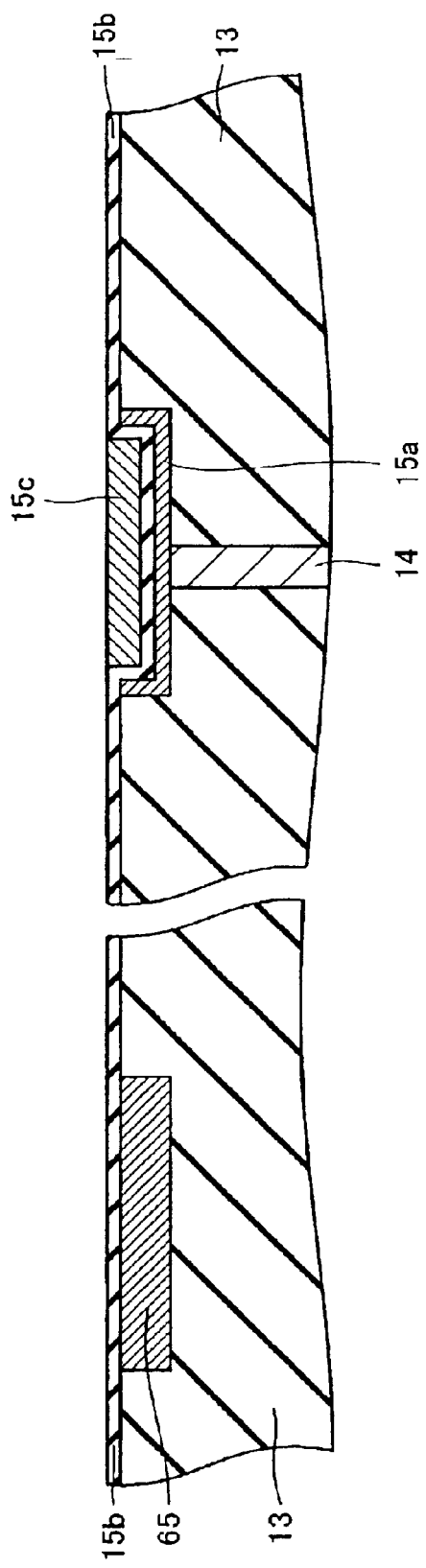

Then, a conductive film 25 is formed to cover the upper surface of the insulator film 15b, as shown in FIG. 7. The conductive film 25 is etched back in the state shown in FIG. 7, thereby forming the conductive film 15c shown in FIG. 8. When the conductive film 25 shown in FIG. 7 is etched back in the step of forming the conductive film 15c, the insulator film 15b functions as a stopper film. In this fabrication step, the upper surfaces of the conductive film 15c and the insulator film 15b are formed to be continuous with each other in parallel with the main surface of the semiconductor substrate 1.

Figure 9:
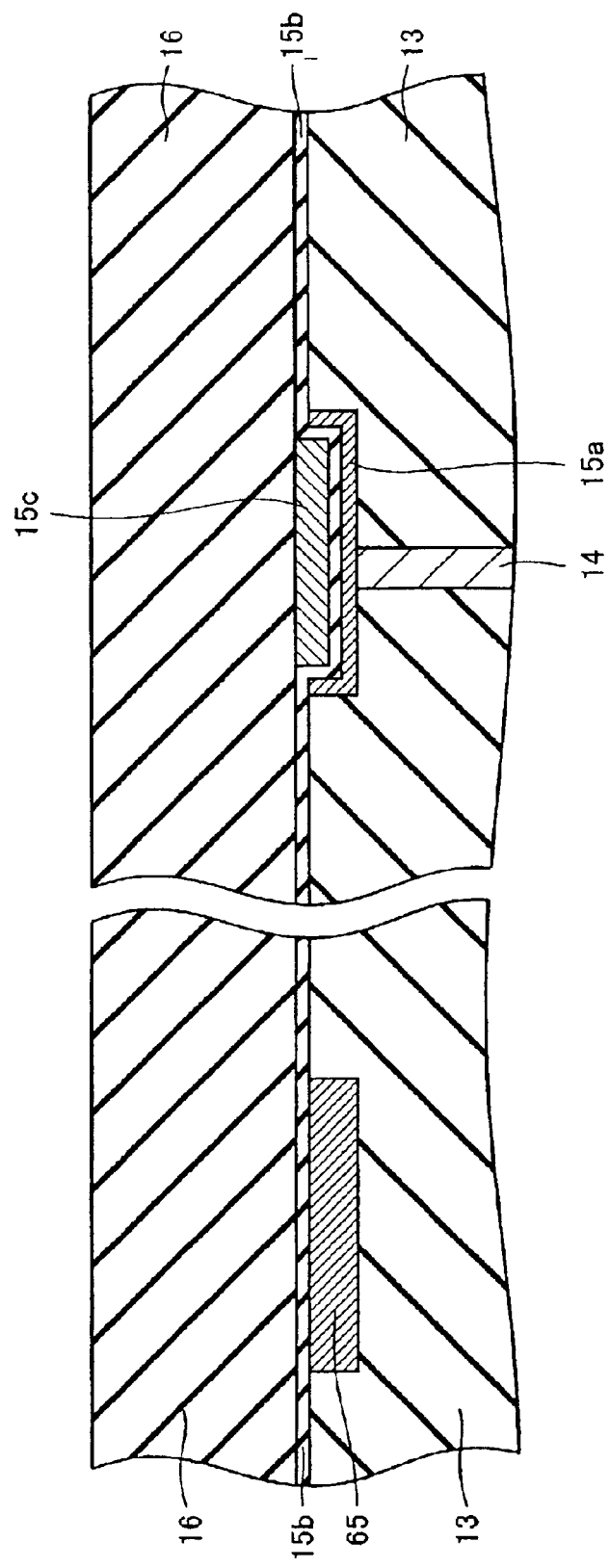
Figure 10:
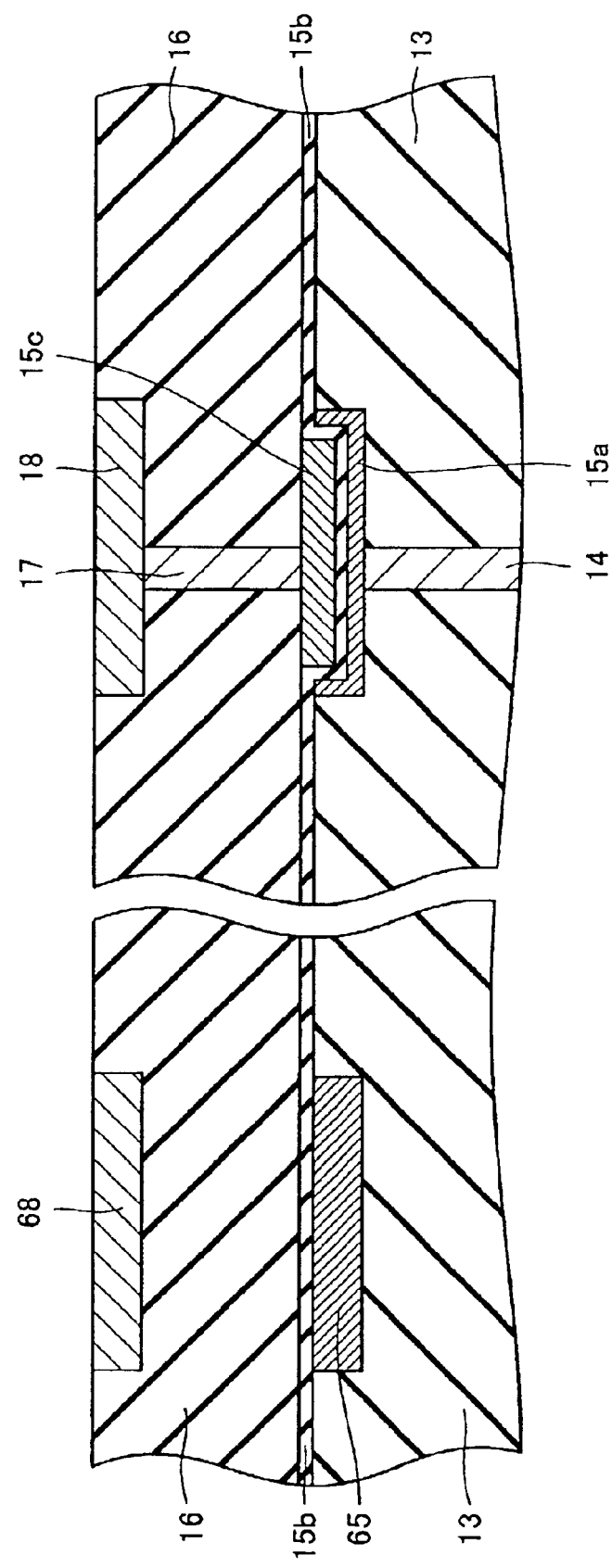

Then, the interlayer dielectric film 16 is formed on the insulator film 15b and the conductive film 15c, as shown in FIG. 9. Then, the via plug 17 vertically passing through the interlayer dielectric film 16 is connected to the conductive film 15d. Thereafter the wiring layers 18 and 68 are formed as shown in FIG. 1.

In the aforementioned method of fabricating the semiconductor device according to this embodiment, the conductive film 15c corresponding to the capacitor upper electrode is provided in the recess portion defined by the insulator film 15b corresponding to the capacitor dielectric film. Therefore, the height of the capacitor can be reduced while increasing the capacitance thereof as compared with the conventional capacitor. Consequently, the height of the wiring layer 65 formed as the dummy pattern corresponding to the capacitor can be reduced. Therefore, the quantity of the material forming the dummy pattern corresponding to the capacitor can be reduced.

According to the aforementioned method, the semiconductor device according to this embodiment can be formed to attain both of the effect capable of increasing the electrostatic capacitance of the capacitor and the effect capable of reducing the quantity of the material forming the dummy pattern corresponding to the capacitor without increasing the area of the capacitor in the direction parallel to the main surface of the semiconductor substrate 1.

Second Embodiment

Figure 11:
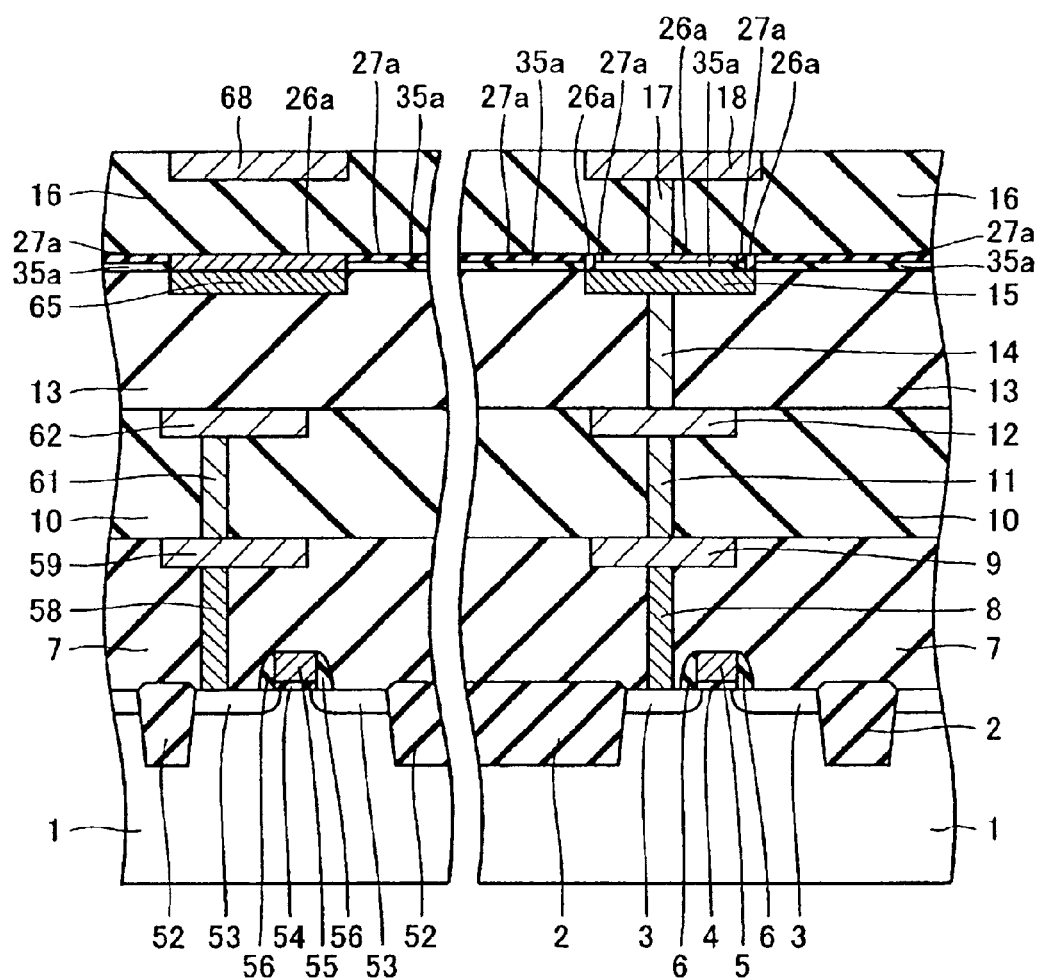
FIG. 11 is a sectional view showing the structure of a semiconductor device according to a second embodiment of the present invention.

The structure of a semiconductor device according to a second embodiment of the present invention and a method of fabricating the same are described with reference to FIGS. 11 to 20. The structure of the semiconductor device according to this embodiment is now described with reference to FIG. 11. As shown in FIG. 11, the structure of the semiconductor device according to this embodiment is substantially similar to that of the semiconductor device according to the first embodiment. In other words, the structure of this semiconductor device up to a via plug 14 formed in an interlayer dielectric film 13 is absolutely similar to that of the semiconductor device according to the first embodiment described with reference to FIG. 1.

Wiring layers 18 and 68 formed in an interlayer dielectric film 16 are also absolutely similar in structure to those of the semiconductor device according to the first embodiment. Therefore, the semiconductor device according to this embodiment is different from the semiconductor device according to the first embodiment only in the structure of a capacitor formed above a gate electrode 55, the structure of a wiring layer formed above the gate electrode 55 and the structures of insulator films formed around the same.

In the semiconductor device according to this embodiment, a conductive film 15 is formed on the via plug 14. Two conductive films 26a extending perpendicularly to the main surface of a semiconductor substrate 1 are connected to both ends of the conductive film 15 respectively. The conductive film 15 and the two conductive films 26a form a capacitor lower electrode.

An insulator film 35a is formed to be in contact with the upper surface of the conductive film 15 as well as the inner side surfaces of the conductive films 26a and to extend in parallel with the main surface of the semiconductor substrate 1. Further, two insulator films 27a are formed to be in contact with the inner side surfaces of the conductive films 26a and to extend perpendicularly to the main surface of the semiconductor substrate 1 from both ends of the insulator film 35a respectively. The insulator film 35a and the two insulator films 27a formed along the surfaces of a recess portion defined by the conductive films 15 and 26a form a capacitor dielectric film.

A conductive film 26a is formed in a recess portion defined by the surfaces of the capacitor dielectric film formed by the insulator films 35a and 27a. The conductive film 26a in the recess portion defined by the surfaces of the capacitor dielectric film forms a capacitor upper electrode.

A further conductor film 26a is formed to be in contact with the upper surface of a wiring layer 65. The wiring layer 65 and the conductive film 26a form a wiring layer of a two-layer structure.

Another insulator film 35a is formed on the upper surface of the interlayer dielectric film 13. A further insulator film 27a is formed on the insulator film 35a.

In the aforementioned semiconductor device according to this embodiment, the two insulator films 27a and the insulator film 35a forming the capacitor insulator film are formed along the surfaces of the recess portion defined by the surfaces of the aforementioned conductive film 15 and the two conductive films 26a forming the capacitor lower electrode. Therefore, the contact area between the capacitor dielectric film formed by the two insulator films 27a and the insulator film 35a and the capacitor lower electrode formed by the conductive films 26a and 15 is larger than that of the conventional capacitor, similarly to the capacitor according to the first embodiment.

In the semiconductor device according to this embodiment, therefore, the capacitance of the capacitor is larger than that in the conventional semiconductor device. The conductive film 26a is embedded in the recess portion defined by the two insulator films 26a and the insulator film 35a forming the capacitor dielectric film. This conductive film 26a functions as a capacitor upper electrode.

Another conductive film 26a is formed on the wiring layer 65. The upper surface of this conductive film 26a formed on the wiring layer 65 and the upper surface of the conductive film 26a forming the capacitor upper electrode are flush with each other with reference to the main surface of the semiconductor substrate 1 and parallel to the main surface of the semiconductor substrate 1.

In the semiconductor device according to this embodiment, the contact area between the capacitor dielectric film and the capacitor lower electrode film is increased without increasing the area of the capacitor in the direction parallel to the main surface of the semiconductor substrate 1, dissimilarly the conventional semiconductor device.

The method of fabricating the semiconductor device according to this embodiment is now described with reference to FIGS. 12 to 20. In the method of fabricating the semiconductor device according to this embodiment, steps up to those of forming wiring layers 12 and 62 are similar to those in the method of fabricating the conventional semiconductor device.

Figure 12:
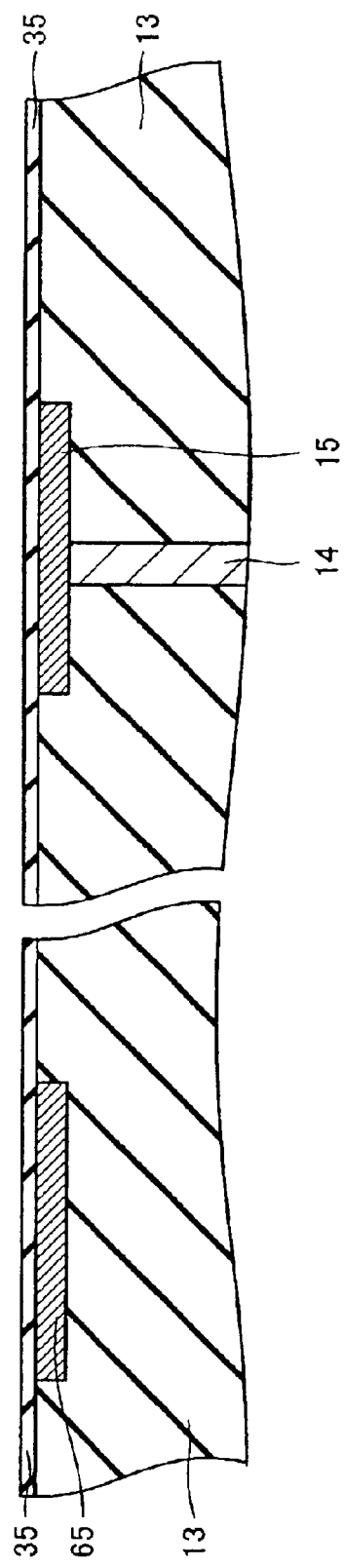
FIGS. 12 to 20 are diagrams for illustrating a method of fabricating the semiconductor device according to the second embodiment of the present invention.

In the method of fabricating the semiconductor device according to this embodiment, the via plug 14 vertically passing through the interlayer dielectric film 13 is connected to a wiring layer 9. Then, the conductive film 15 in contact with the upper surface of the via plug 14 and the wiring layer 65 located above the gate electrode 55 are formed on the same layer. At this time, the surfaces of the interlayer dielectric film 13, the conductive film 15 and the wiring layer 65 are parallel to the main surface of the semiconductor substrate 1. Then, an insulator film 35 extending in parallel with the main surface of the semiconductor substrate 1 is formed on the upper surfaces of the interlayer dielectric film 13, the conductive film 15 and the wiring layer 65, as shown in FIG. 12.

Figure 13:
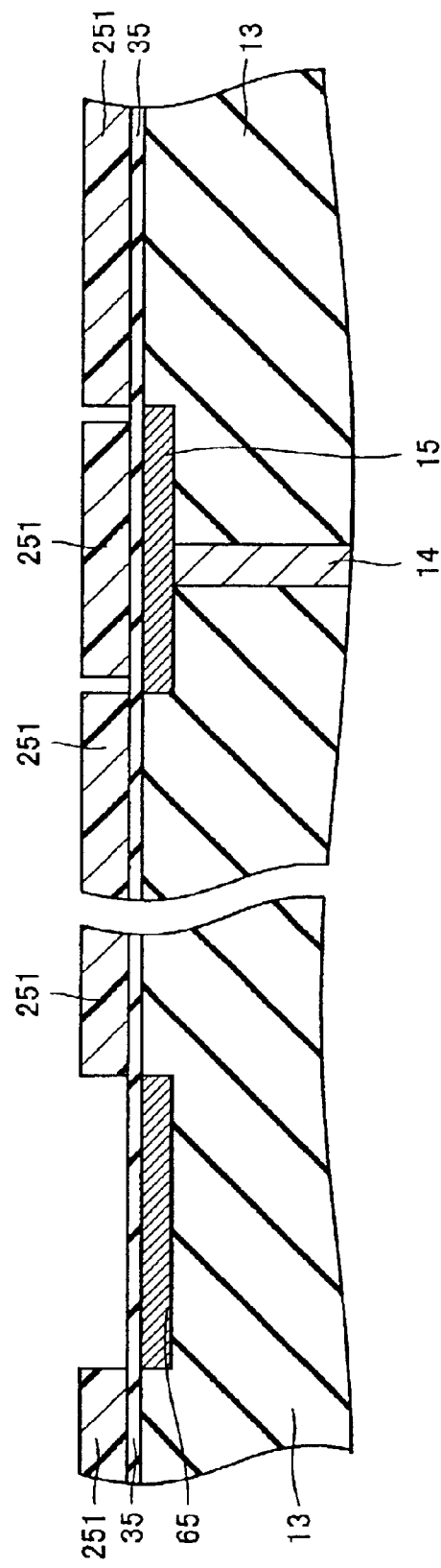

As shown in FIG. 13, a resist film 251 is formed to have openings in portions located on the upper surface of the wiring layer 65 and portions located on positions at prescribed distances from both ends of the upper surface of the conductive film 15.

The resist film 251 is employed as a mask for etching the insulator film 35 in the state shown in FIG. 13. This etching is performed until the surfaces of the conductive film 15 and the wiring layer 65 are exposed, thereby forming the insulator films 35a shown in FIG. 14.

Figure 14:
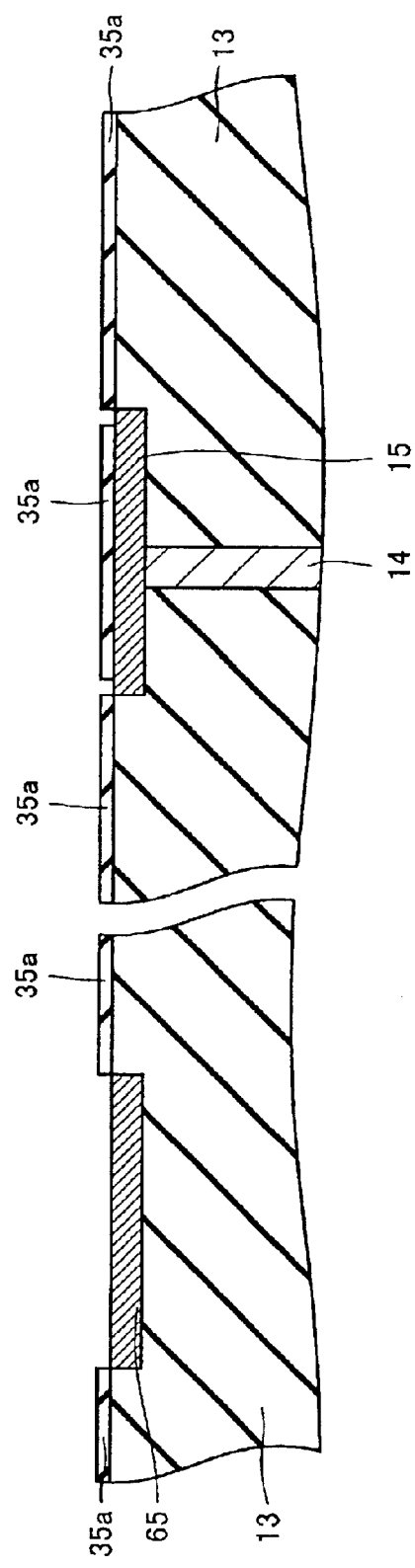
Figure 15:
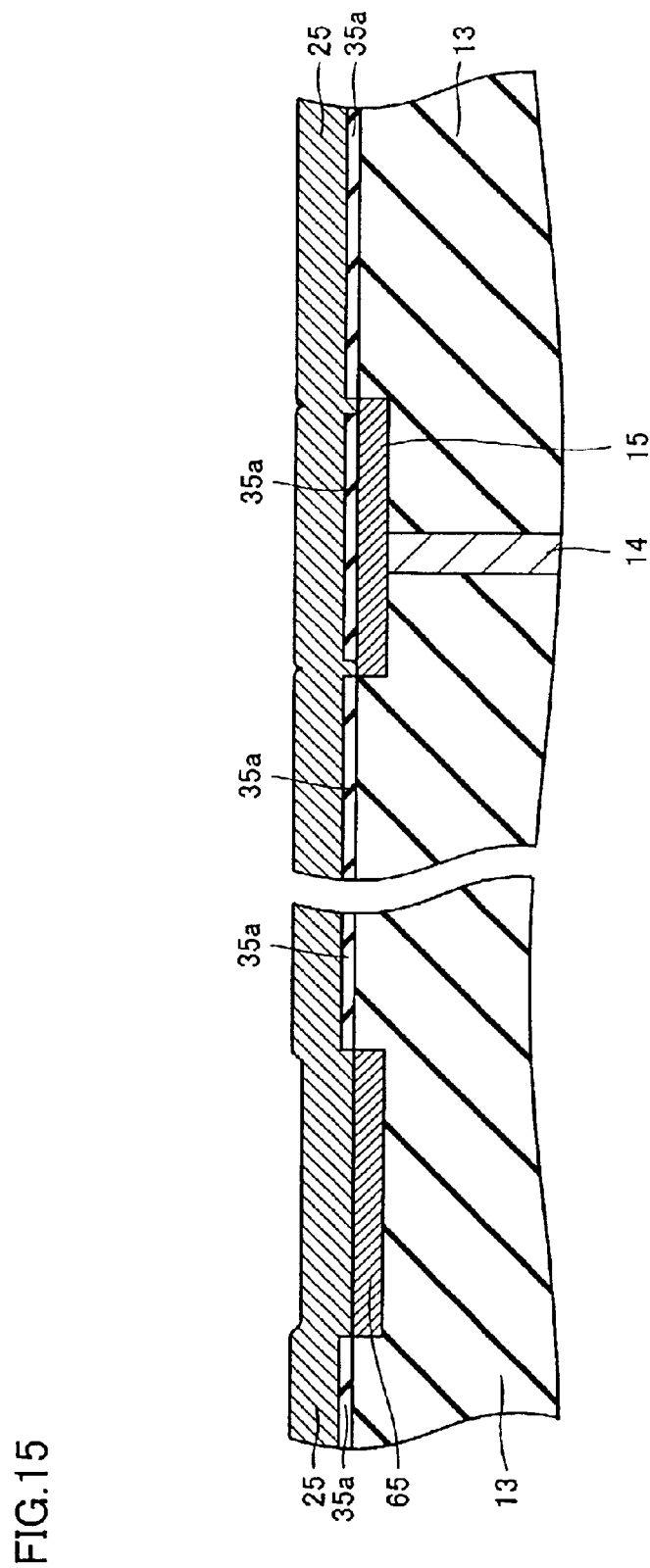
Figure 16:
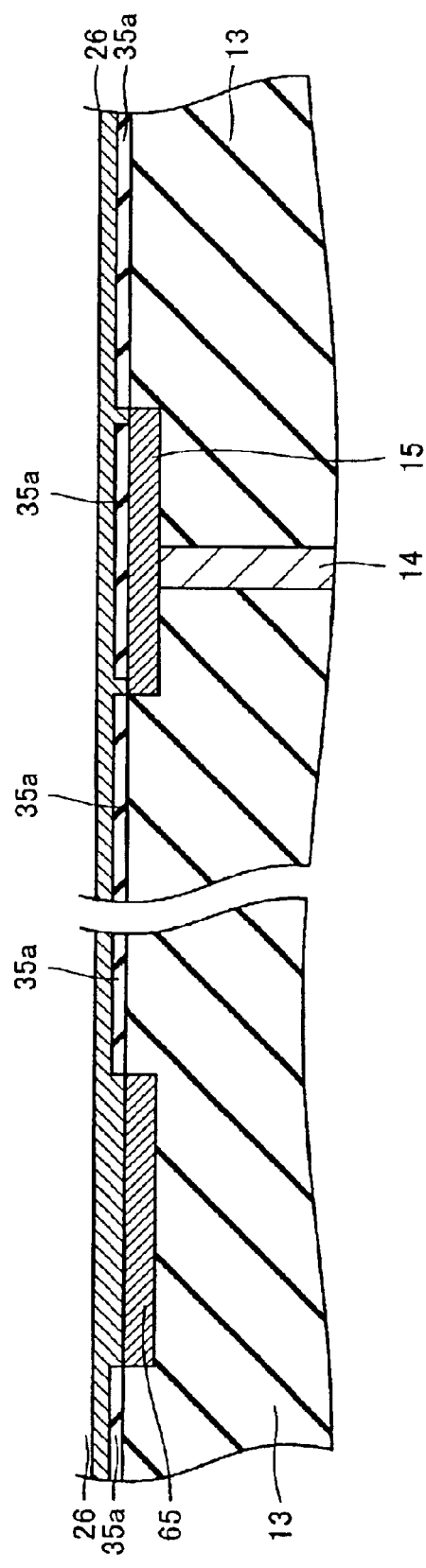

In the state shown in FIG. 14, a conductive film 25 is formed entirely over the main surface of the semiconductor substrate 1, to extend in parallel with the main surface of the semiconductor substrate 1. Thus, a structure shown in FIG. 15 is obtained. Then, the conductive film 25 is etched back so that the upper surface thereof is flattened. Thus, a structure shown in FIG. 16 is obtained.

Figure 17:
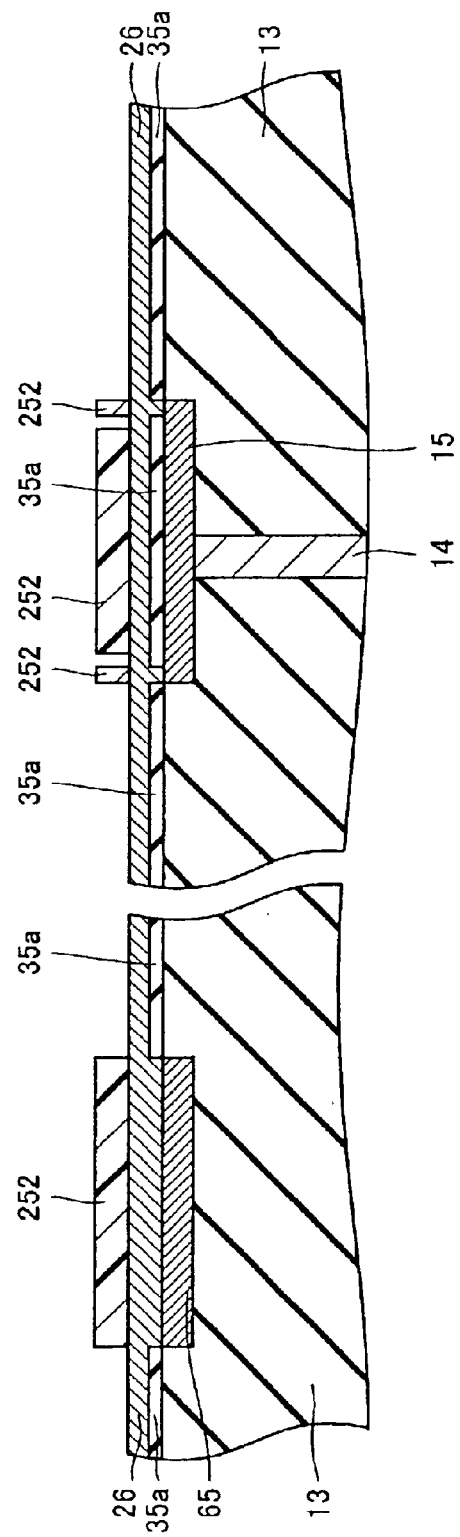

Then, resist films 252 are formed to cover the overall region located on the wiring layer 65, the regions located on the conductive film 15 and not covered with the insulator film 35a and the region located on the conductive film 15 inside the positions at prescribed distances from both ends of the insulator film 35a, as shown in FIG. 17.

Figure 18:
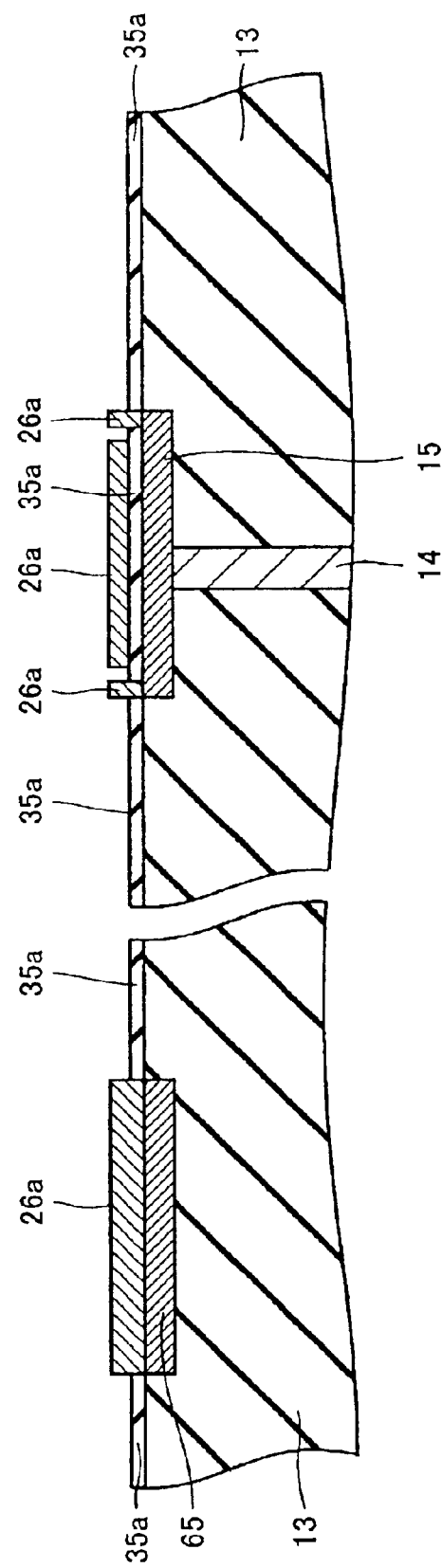
Figure 19:
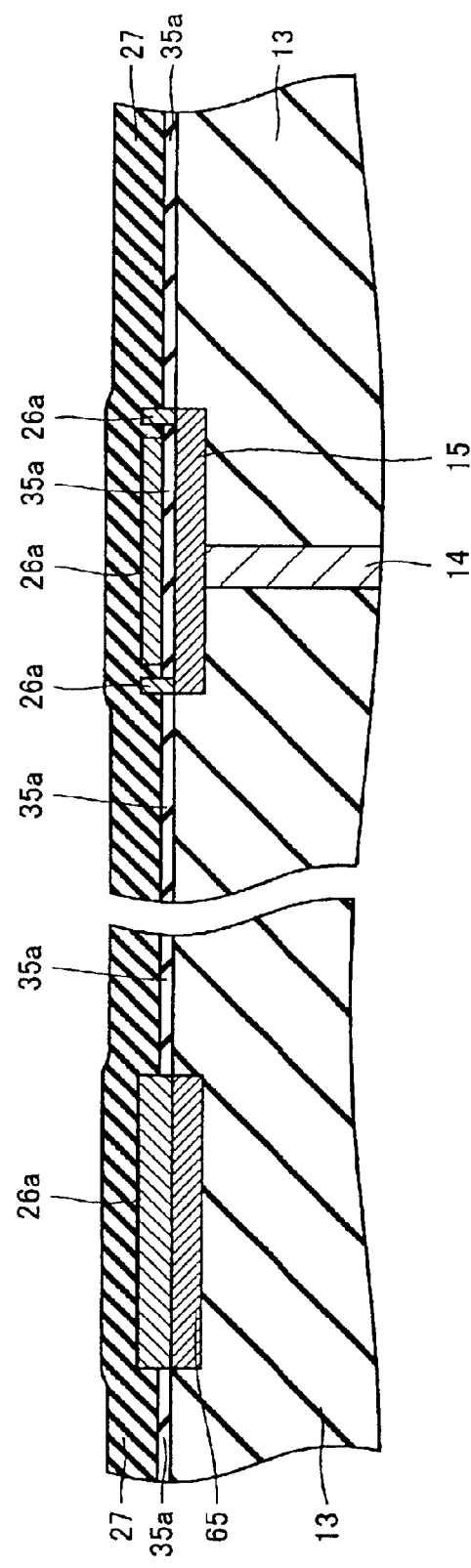

The conductive film 26 is etched back in the state shown in FIG. 17. Thus, the conductive film 26a is formed on the wiring layer 65, as shown in FIG. 18. Further, the two conductive films 26a connected to both ends of the conductive film 15 respectively are formed to extend perpendicularly to the main surface of the semiconductor substrate 1. In addition, the conductive film 26a extending in parallel with the main surface of the semiconductor substrate 1 is formed in the region inside the positions at prescribed distances from the conductive films 26a connected to both ends of the conductive film 15 respectively.

Figure 20:
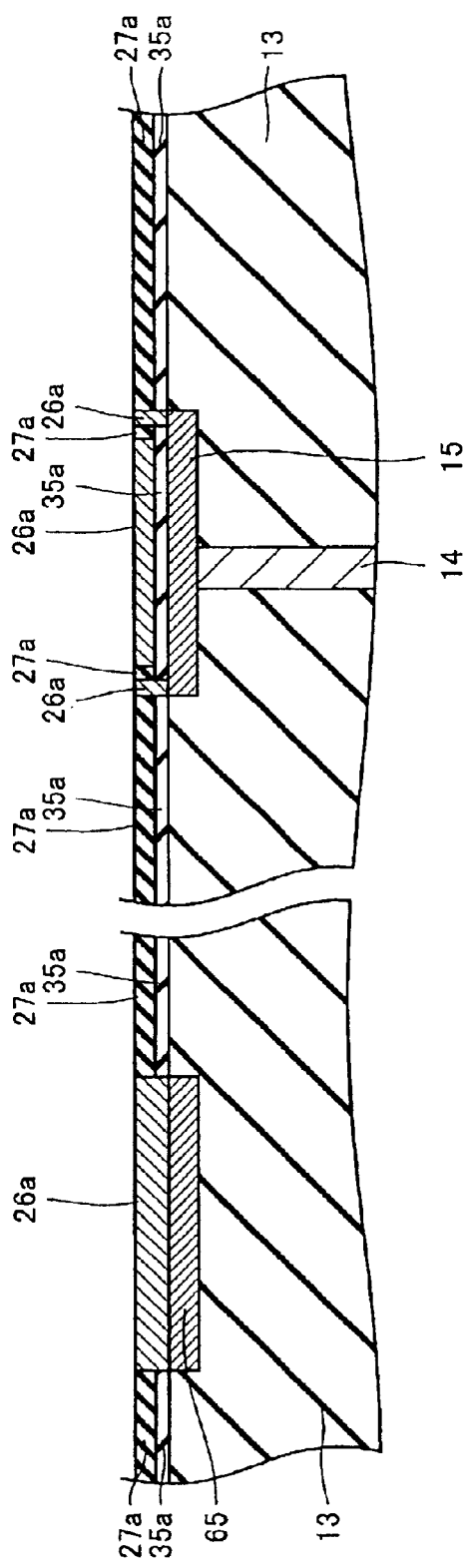
Figure 21:
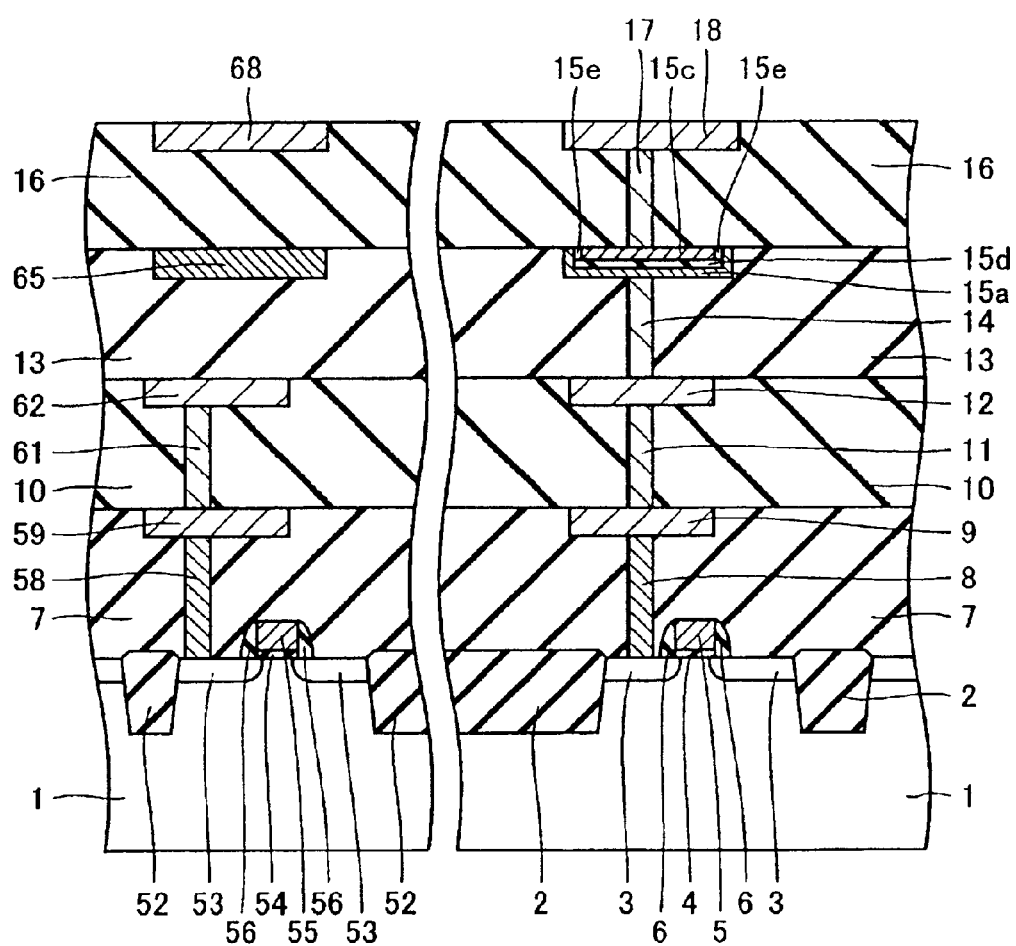
FIG. 21 is a sectional view showing the structure of a semiconductor device according to a third embodiment of the present invention.

Then, an insulator film 27 is formed to cover the overall region of the semiconductor substrate 1 in the state shown in FIG. 18. Then, the insulator film 27 is etched back until the upper surfaces of the conductive films 26a are exposed in a state shown in FIG. 19. Thus, the two insulator films 27a extending perpendicularly to the main surface of the semiconductor substrate 1 are connected to both ends of the insulator film 35a respectively on the conductive film 15 between the conductive films 26a connected to the conductive film 15 and the conductive film 26a not in contact with the conductive film 15, as shown in FIG. 20. Further, the insulator film 27a is formed to be in contact with the upper surface of the insulator film 35a and to extend in parallel with the main surface of the semiconductor substrate 1. At this time, the upper surfaces of the insulator films 27a and the conductive films 26a are integrally continuous with each other in the state parallel to the main surface of the semiconductor substrate 1.

According to the aforementioned method, the conductive film 15 and the two conductive films 26a connected to both ends of the conductive film 15 respectively to extend perpendicularly to the main surface of the semiconductor substrate 1 form the capacitor lower electrode. Further, the two insulator films 27a extending perpendicularly to the main surface of the semiconductor substrate 1 along the surfaces of the recess portion defined by the capacitor lower electrode and the insulator film 35a connected with the lower ends of the two insulator films 27a to extend in parallel with the main surface of the semiconductor substrate 1 form the capacitor dielectric film.

According to this method, therefore, the contact area between the capacitor dielectric film and the capacitor lower electrode can be increased without increasing the size of the capacitor dielectric film in the direction parallel to the main surface of the semiconductor substrate 1, similarly to the method of fabricating the semiconductor device according to the first embodiment. Therefore, the electrostatic capacitance of the capacitor can be increased without increasing the size of the capacitor in the direction parallel to the main surface of the semiconductor substrate 1.

The conductive film 26a corresponding to the capacitor upper electrode is provided in the recess portion defined by the insulator films 35a and 27a corresponding to the capacitor dielectric film. Therefore, the height of the capacitor can be reduced while increasing the capacitance thereof as compared with the conventional capacitor. Consequently, the height of the wiring layer 65 formed as a dummy pattern corresponding to the capacitor can be reduced. Therefore, the quantity of the material forming the dummy pattern corresponding to the capacitor can be reduced.

Consequently, the method of fabricating the semiconductor device according to this embodiment can attain the effect capable of increasing the electrostatic capacitance of the capacitor while reducing the quantity of the material forming the dummy pattern corresponding to the capacitor without increasing the size of the capacitor in the direction parallel to the main surface of the semiconductor substrate 1.

Thereafter a step of forming a via plug 17 in the conductive film 26a forming the capacitor upper electrode and the like are carried out similarly to the method of fabricating the semiconductor device according to the first embodiment.

Third Embodiment

The structure of a semiconductor device according to a third embodiment of the present invention and a method of fabricating the same are described with reference to FIGS. 21 to 27. The structure of the semiconductor device according to this embodiment is now described with reference to FIG. 21. The structure of the semiconductor device according to this embodiment is absolutely similar to that of the semiconductor device according to the first or second embodiment shown in FIGS. 1 or 11 up to an interlayer dielectric film 13.

Wiring layers 18 and 68 are also absolutely similar in structure to those of the semiconductor device according to the first or second embodiment. Therefore, the semiconductor device according to this embodiment is different from the semiconductor device according to the first or second embodiment only in the structures of a region formed with a capacitor and a peripheral portion thereof.

In the semiconductor device according to this embodiment, a conductive film 15a forming a capacitor lower electrode is formed on a via plug 14 vertically extending in the interlayer dielectric film 13. The conductive film 15a forming the capacitor lower electrode has portions extending perpendicularly to the main surface of a semiconductor substrate 1 and a portion connected to inner sides of both ends thereof to extend in parallel with the main surface of the semiconductor substrate 1.

An insulator film 15d is formed along the bottom surface of a recess portion defined by the conductive film 15a. Two insulator films 15e extending perpendicularly to the main surface of the semiconductor substrate 1 are formed in contact with the inner side surfaces of the portions of the conductive film 15a extending perpendicularly to the main surface of the semiconductor substrate 1 on both ends of the insulator film 15d. A conductive film 15c is formed to be in contact with the inner side surfaces of the two insulator films 15e as well as the upper surface of the insulator film 15d. A via plug 17 is formed to be in contact with the upper surface of the conductive film 15e.

In the semiconductor device according to this embodiment having the aforementioned structure, the capacitor lower electrode is formed to have the portions extending perpendicularly to the main surface of the semiconductor substrate 1 and the portion extending in parallel with the main surface of the semiconductor substrate 1. Therefore, the surfaces of the capacitor lower electrode define a recess portion. The contact area between the surface of the recess portion defined by the capacitor lower electrode and the insulator films 15e and 15d formed along the surfaces of the recess portion to form the capacitor dielectric film is larger than that in the conventional capacitor. Therefore, the capacitance of the capacitor is increased similarly to the capacitor according to the first or second embodiment. In the semiconductor device according to this embodiment, further, the capacitance of the capacitor can be increased without horizontally increasing the size of the capacitor dielectric film.

In addition, the conductive film 15c corresponding to the capacitor upper electrode is provided in the recess portion defined by the insulator films 15d and 15e corresponding to the capacitor dielectric film. Therefore, the height of the capacitor can be reduced while increasing the capacitance thereof as compared with the conventional capacitor. Consequently, the height of a wiring layer 65 formed as a dummy pattern corresponding to the capacitor can be reduced. Therefore, the quantity of the material forming the dummy pattern corresponding to the capacitor can be reduced.

Consequently, both of the effect capable of increasing the electrostatic capacitance of the capacitor and the effect capable of reducing the quantity of the material forming the dummy pattern corresponding to the capacitor can be attained without increasing the size of the capacitor in the direction parallel to the main surface of the semiconductor substrate 1.

The method of fabricating the semiconductor device according to the third embodiment is now described with reference to FIGS. 22 to 27. Steps of the method of fabricating the semiconductor device according to this embodiment are absolutely similar to those of the first or second embodiment up to that of forming the via plug 14 in the interlayer dielectric film 13.

Then, a conductive film 15 is formed to be in contact with the upper surface of the via plug 14 along with formation of the wiring layer 65. The conductive film 15 and the wiring layer 65 are flush with each other with reference to the main surface of the semiconductor substrate 1. At this time, the upper surfaces of the interlayer dielectric film 13, the conductive film 15 and the wiring layer 65 are formed to be continuous with each other and substantially parallel to the main surface of the semiconductor substrate 1.

Figure 22:
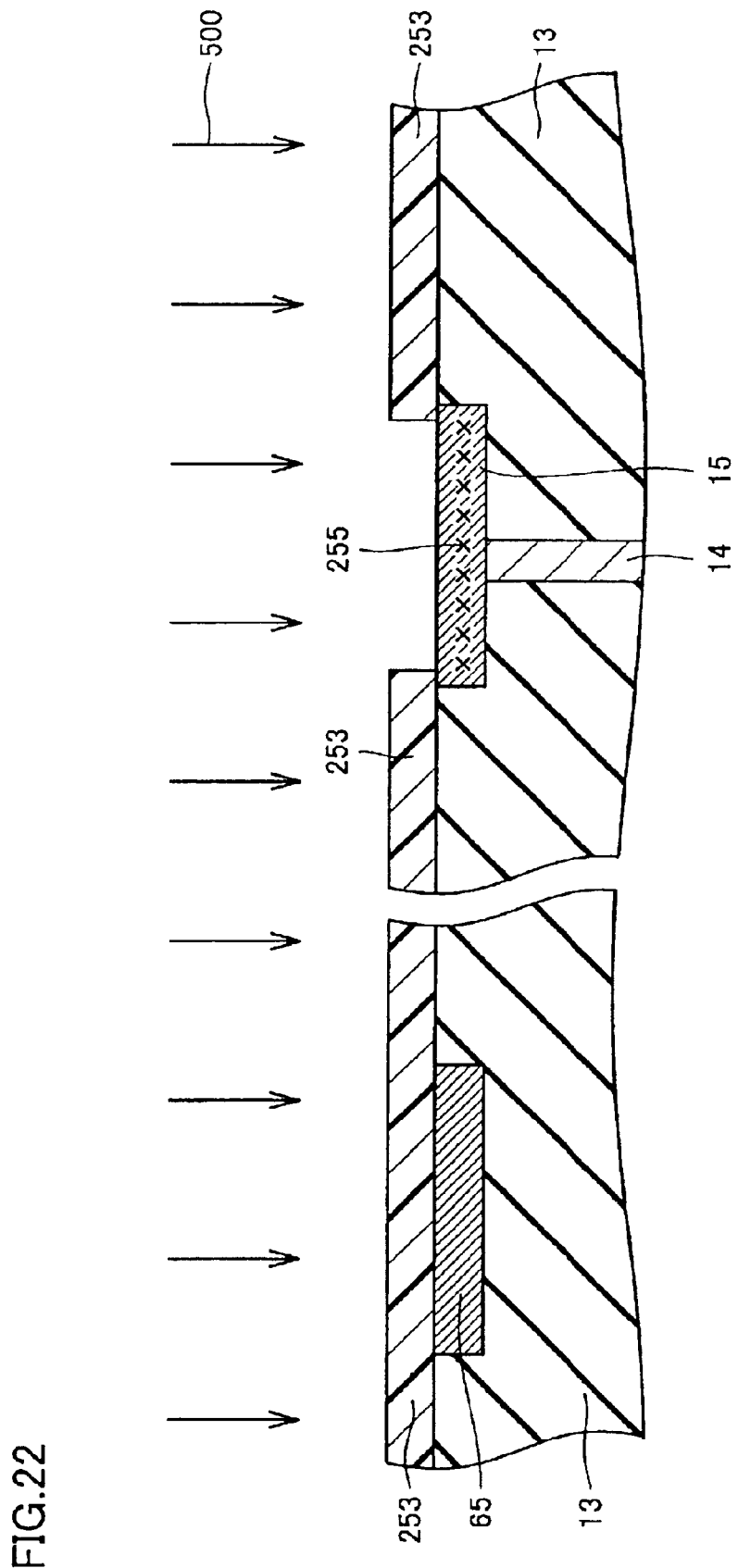
FIGS. 22 to 27 are diagrams for illustrating a method of fabricating the semiconductor device according to the third embodiment of the present invention.

Then, a resist film 253 is formed with an opening only in a portion inside portions at prescribed distances from both ends of the conductive film 15, as shown in FIG. 22. Then, the resist film 253 is employed as a mask for ion-implanting oxygen into the conductive film 15. The dose of and the implantation energy in this ion implantation are so adjusted that implanted oxygen ions segregate substantially on the central portion along the thickness of the conductive film 15. The portion of the conductive film 15 where the oxygen ions segregate is converted to a metal oxide film, a silicon oxide film or the like.

Figure 23:
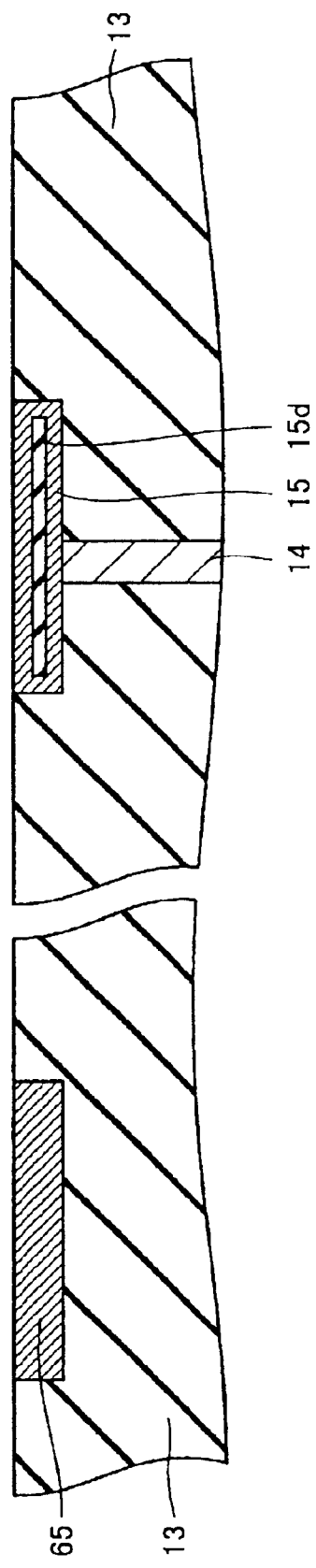

Consequently, the insulator film 15d is formed inside the conductive film 15, as shown in FIG. 23. This insulator film 15d is formed as a film distinguishable from the conductive film 15. The conductive film 15 is formed by a metal film of copper or aluminum or a polycrystalline silicon film.

Figure 24:
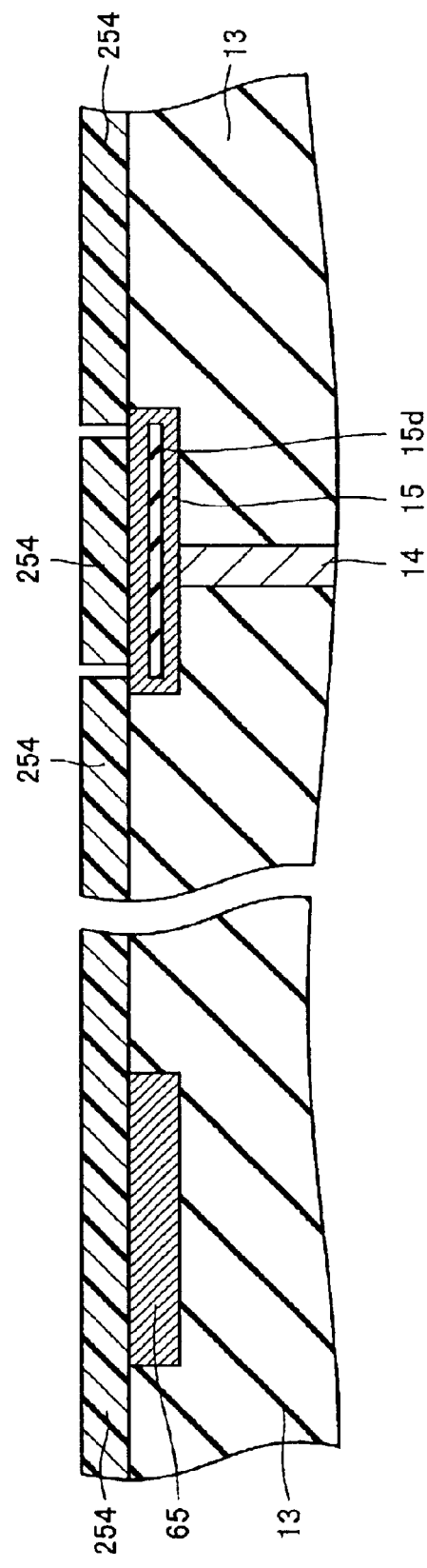

Then, a resist film 254 is formed to cover the interlayer dielectric film 13 and the wiring layer 65 as well as regions outside positions at prescribed distances from both ends of the conductive film 15, as shown in FIG. 24. Another resist film 254 is formed also on the insulator film 15d. This resist film 254 is formed on a region inside positions at prescribed distances from both ends of the insulator film 15d. Thus, the resist film 254 defines openings formed on regions inside the positions at prescribed distances from both ends of the insulator film 15d.

Figure 25:
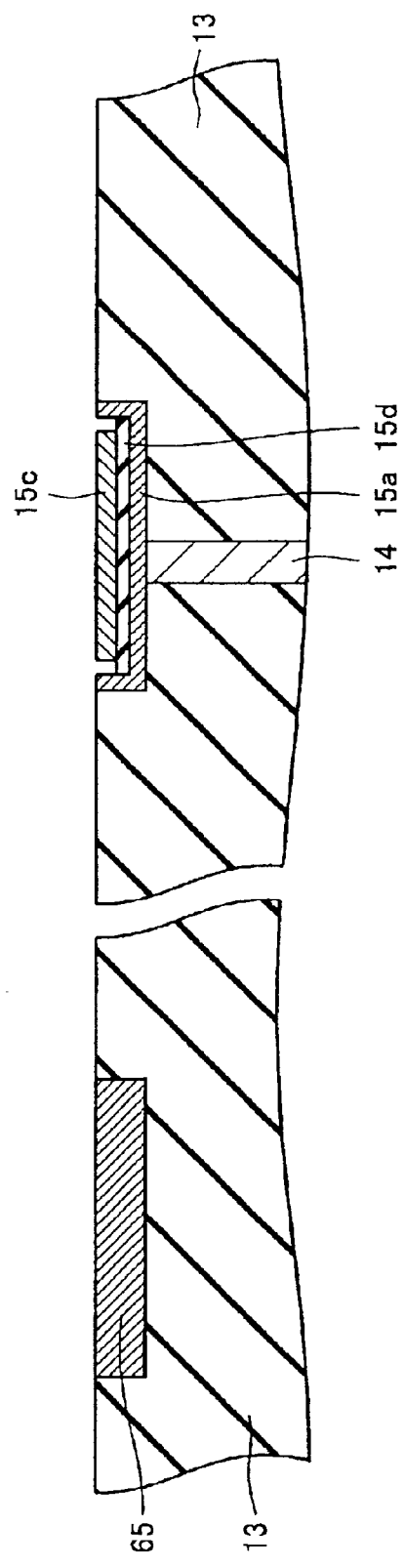

In the state shown in FIG. 24, the resist films 254 are employed as masks for etching the conductive film 15. This etching is performed until the surface of the insulator film 15d is exposed. Thus, the conductive film 15 shown in FIG. 24 is separated into the conductive films 15a and 15c, as shown in FIG. 25. The conductive film 15a forms the capacitor lower electrode, while the conductive film 15c forms the capacitor upper electrode.

Figure 26:
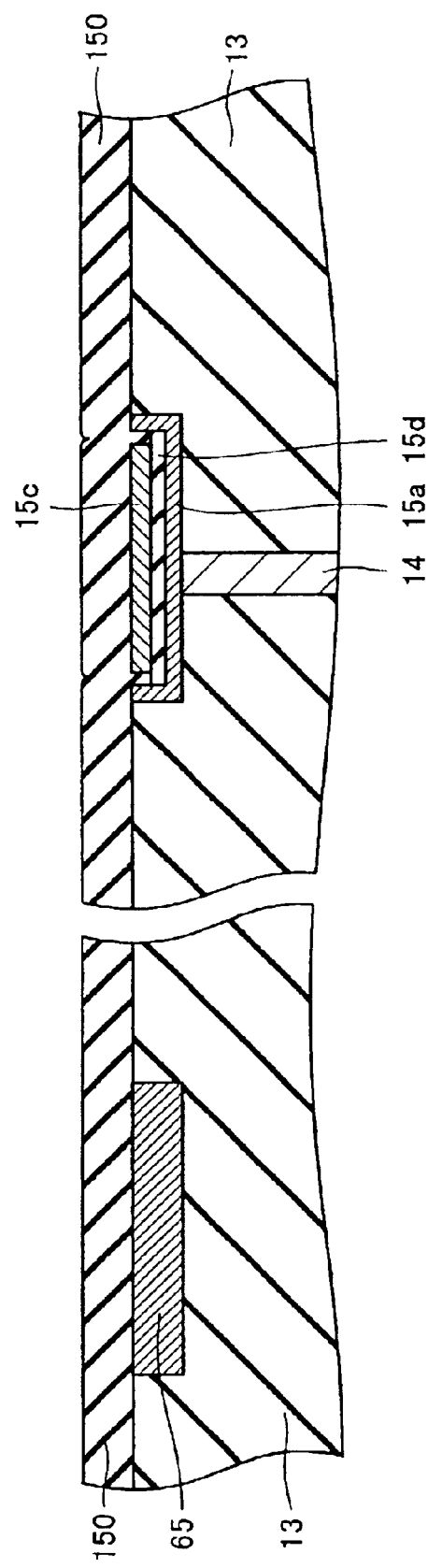
Figure 27:
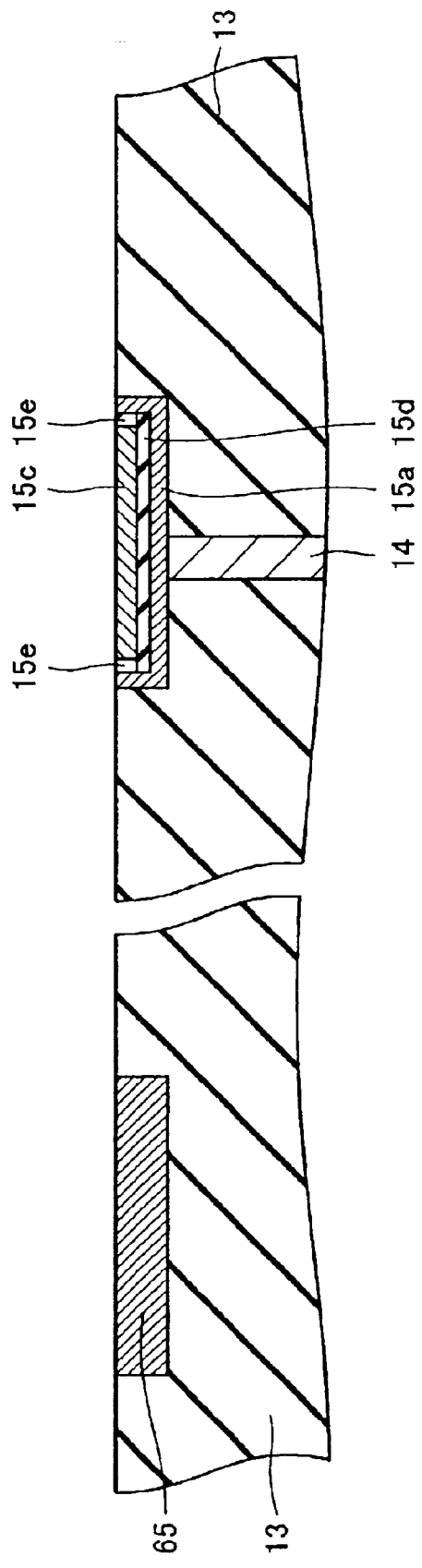

Then, an insulator film 150 is formed in parallel with the main surface of the semiconductor substrate 1 to fill up the recess portion defined by the insulator film 15d and the conductive films 15a and 15c and cover the upper surfaces of the interlayer dielectric film 13 and the wiring layer 65, as shown in FIG. 26. This insulator film 150 is etched back for exposing the upper surfaces of the interlayer dielectric film 13, the conductive films 15a and 15c and the wiring layer 65. Thus, a structure shown in FIG. 27 is obtained.

In the aforementioned method of fabricating the semiconductor device according to this embodiment, the conductive film 15a forming the capacitor lower electrode is formed to have the portions extending perpendicularly to the main surface of the semiconductor substrate 1 and the portion extending in parallel with the main surface of the semiconductor substrate 1. Further, the capacitor dielectric film is formed by the insulator film 15d extending in parallel with the main surface of the semiconductor substrate 1 and the two insulator films 15e extending perpendicularly to the main surface of the semiconductor substrate 1 on both ends of the insulator film 15d.

Consequently, the contact area between the capacitor lower electrode and the capacitor dielectric film can be increased without increasing the size of the capacitor in a direction substantially parallel to the main surface of the semiconductor substrate 1 in the method of fabricating the semiconductor device according to this embodiment, similarly to the capacitors formed according to the first and second embodiments. Thus, the capacitance of the capacitor can be increased without increasing the area of the capacitor in the direction parallel to the main surface of the semiconductor substrate 1.

The conductive film 15c corresponding to the capacitor upper electrode is provided in the recess portion defined by the insulator films 15d and 15e corresponding to the capacitor dielectric film. Therefore, the height of the capacitor can be reduced while increasing the capacitance thereof as compared with the conventional capacitor. Consequently, the height of the wiring layer 65 formed as a dummy pattern corresponding to the capacitor can be reduced. Therefore, the quantity of the material forming the dummy pattern corresponding to the capacitor can be reduced.

Consequently, the method of fabricating the semiconductor device according to this embodiment can attain both of the effect capable of increasing the electrostatic capacitance of the capacitor and the effect capable of reducing the quantity of the material forming the dummy pattern corresponding to the capacitor without increasing the size of the capacitor in the direction parallel to the main surface of the semiconductor substrate 1.

Fourth Embodiment

The structure of a semiconductor device according to a fourth embodiment of the present invention and a method of fabricating the same are described with reference to FIGS. 28 to 33. The structure of the semiconductor device according to this embodiment is now described with reference to FIG. 28.

Figure 28:
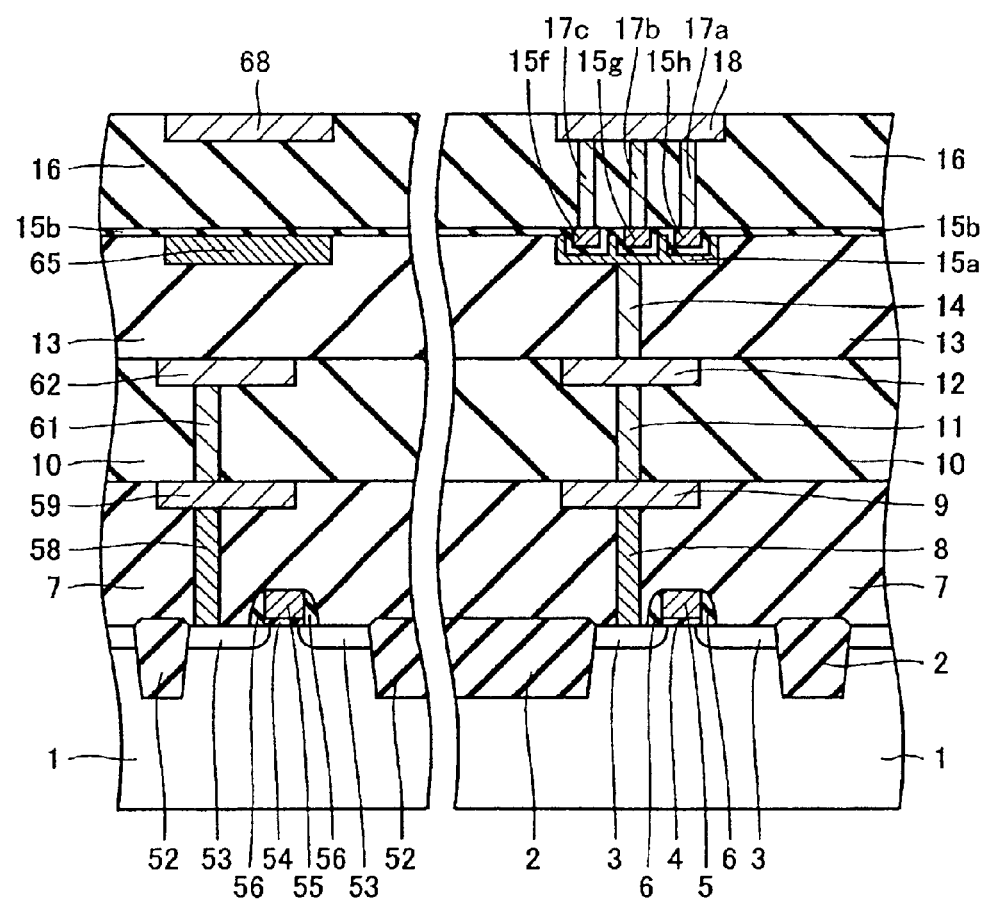
FIG. 28 is a sectional view showing the structure of a semiconductor device according to a fourth embodiment of the present invention.

The structure of the semiconductor device according to this embodiment is absolutely similar to that of the semiconductor device according to each of the first to third embodiments up to an interlayer dielectric film 13. In the semiconductor device according to this embodiment, a via plug 14 is formed to vertically pass through the interlayer dielectric film 13, as shown in FIG. 28. A conductive film 15a having a plurality of trenches is formed on the via plug 14. The plurality of trenches extend perpendicularly to the plane of FIG. 28. The conductive film 15a forms a capacitor lower electrode.

An insulator film 15b is formed along the upper surface of the interlayer dielectric film 13, the upper surface of a wiring layer 65 and the surfaces of the plurality of trenches defined by the conductive film 15a respectively. This insulator film 15b forms a capacitor dielectric film.

Conductive films 15f, 15g and 15h are formed in the plurality of trenches provided in the insulator film 15b. The conductive films 15f, 15g and 15h form a capacitor upper electrode.

An interlayer dielectric film 16 formed on the insulator film 15b is provided with via plugs 17c, 17b and 17a connected with the conductive films 15f, 15g and 15h respectively. A wiring layer 18 is connected to the upper surfaces of the via plugs 17c, 17b and 17a. This wiring layer 18 and a wiring layer 68 are flush with each other with reference to the main surface of a semiconductor substrate 1.

In the aforementioned semiconductor device according to this embodiment, the surfaces of the conductive film 15a forming the capacitor lower electrode define the plurality of trenches. Therefore, the contact area between the conductive film 15a forming the capacitor lower electrode and the insulator film 15b forming the capacitor dielectric film can be increased without increasing the size of the capacitor lower electrode in a direction parallel to the main surface of the semiconductor substrate 1.

Therefore, the semiconductor device according to this embodiment can increase the capacitance of the capacitor without increasing the size thereof in the direction parallel to the semiconductor substrate 1.

The conductive films 15*f*, 15*g* and 15*h* corresponding to the capacitor upper electrode are provided in the plurality of recess portions defined by the insulator film 15*b* corresponding to the capacitor dielectric film respectively. Therefore, the height of the capacitor can be reduced while increasing the capacitance thereof as compared with the conventional capacitor. Consequently, the height of the wiring layer 65 formed as a dummy pattern corresponding to the capacitor can be reduced. Therefore, the quantity of the material forming the dummy pattern corresponding to the capacitor can be reduced.

Consequently, the semiconductor device according to this embodiment can attain both of the effect capable of increasing the electrostatic capacitance of the capacitor and the effect capable of reducing the quantity of the material forming the dummy pattern corresponding to the capacitor without increasing the size of the capacitor in the direction parallel to the main surface of the semiconductor substrate 1.

The electrostatic capacitance of the capacitor can be further increased as compared with those in the semiconductor devices according to the first to third embodiments.

The method of fabricating the semiconductor device according to the third embodiment is now described with reference to FIGS. 29 to 33. Steps of the method of fabricating the semiconductor device according to this embodiment are absolutely similar to those in each of the first to third embodiments up to that of forming the via plug 14 in the interlayer dielectric film 13.

Figure 29:
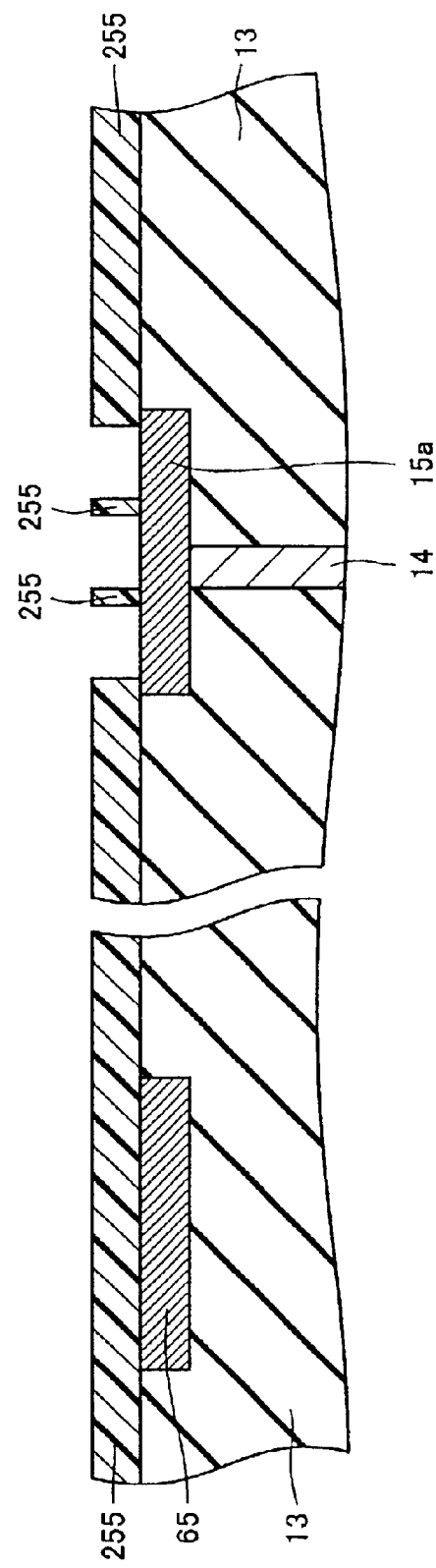
FIGS. 29 to 33 are diagrams for illustrating a method of fabricating the semiconductor device according to the fourth embodiment of the present invention.

In the method of fabricating the semiconductor device according to this embodiment, the via plug 14 is formed to vertically pass through the interlayer dielectric film 13, as shown in FIG. 29. The conductive film 15*a* is formed to be in contact with the upper surface of the via plug 14, while the wiring layer 65 is formed to be flush with the conductive film 15*a*.

A resist film 255 is formed to cover the upper surfaces of the interlayer dielectric film 13 and the wiring layer 65 as well as regions outside positions at prescribed distances from both ends of the conductive film 15*a*. Two isolated resist films 255 are formed in the vicinity of the central portion on the upper surface of the conductive film 15*a*.

Figure 30:
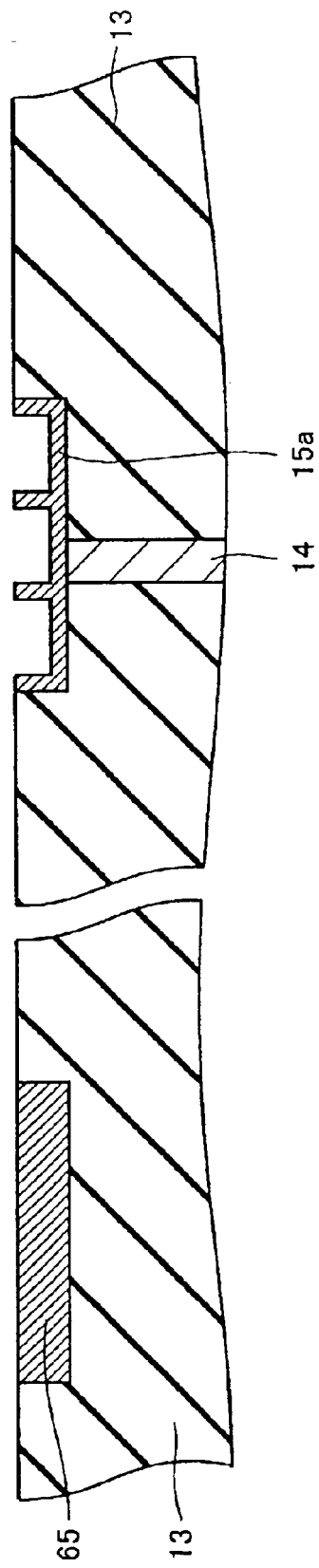

In the state shown in FIG. 29, the resist films 255 are employed as masks for etching the conductive film 15*a*, thereby obtaining a structure shown in FIG. 30. The conductive film 15*a* shown in FIG. 30 forms the capacitor lower electrode. In the structure shown in FIG. 30, the conductive film 15*a* has an interdigital shape. The conductive film 15*a* forming the capacitor lower electrode has three trenches extending perpendicularly to the plane of FIG. 30. In other words, the conductive film 15*a* forming the capacitor lower electrode is provided with four side wall portions extending perpendicularly to the main surface of the semiconductor substrate 1 and a bottom surface portion, extending in parallel with the main surface of the semiconductor substrate 1 under the four side wall portions, integrally formed with the lower ends of the four side wall portions.

Figure 31:
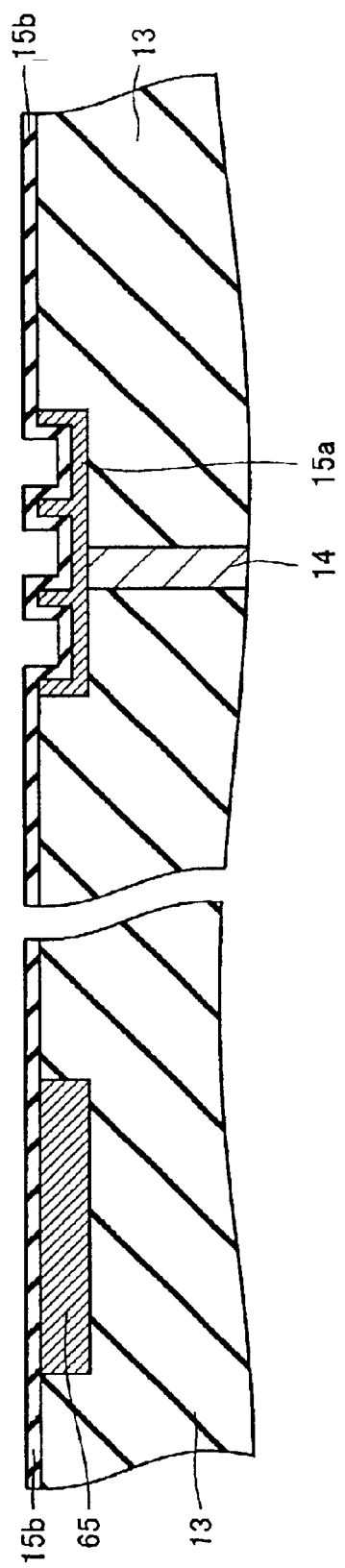
Figure 32:
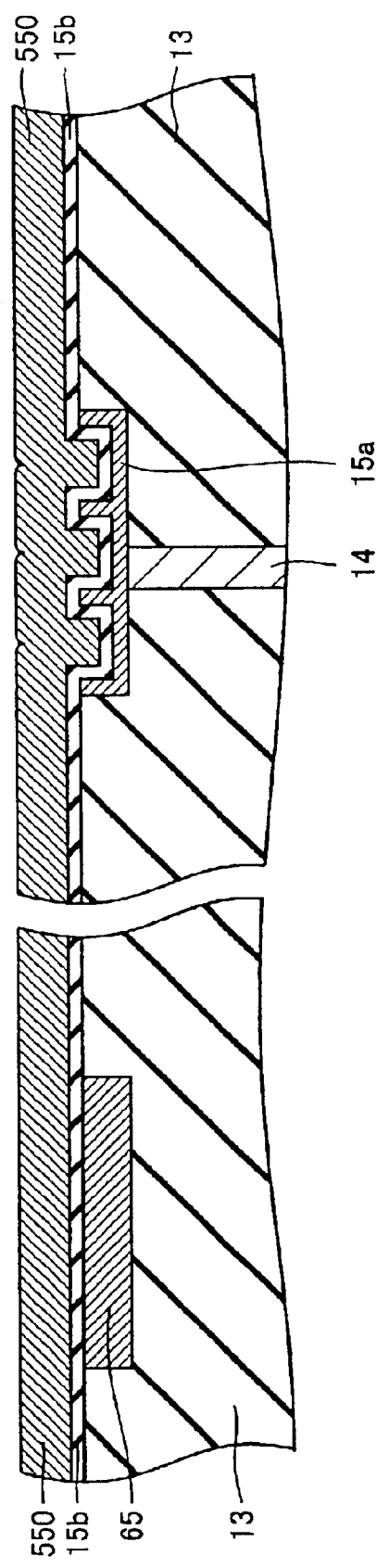

As shown in FIG. 31, the insulator film 15*b* is formed in a constant thickness along the upper surfaces of the interlayer dielectric film 13 and the wiring layer 65 and the surfaces of the conductive film 15*a*. As shown in FIG. 32, a conductive film 550 is formed to cover the surfaces of the insulator film 15*b*. At this time, the conductive film 550 is so formed as to fill up the plurality of recess portions defined by the surfaces of the insulator film 15*b* respectively.

Figure 33:
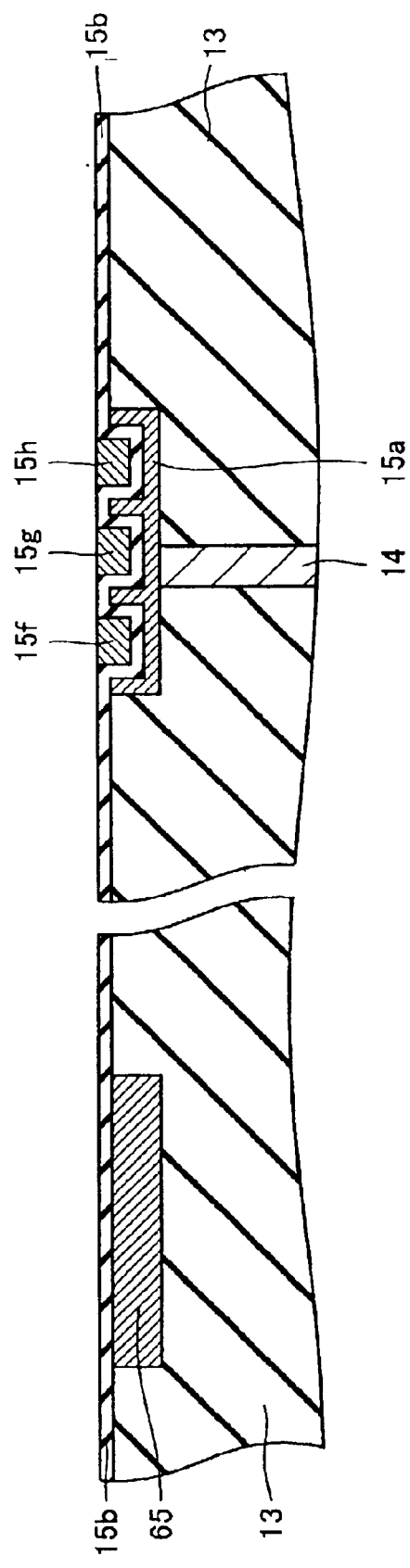

Then, the conductive film 550 is etched back for exposing the upper surface of the insulator film 15*b*, thereby obtaining a structure shown in FIG. 33. In the structure shown in FIG. 33, the upper surface of the insulator film 15*b* and the upper surfaces of the conductive films 15*f*, 15*g* and 15*h* filling up the recess portions defined by the surfaces of the insulator film 15*b* respectively are flush with each other with reference to the main surface of the semiconductor substrate 1.

Then, the via plugs 17*c*, 17*b* and 17*a* connected to the conductive films 15*f*, 15*g* and 15*h* forming the capacitor upper electrode respectively are provided in the interlayer dielectric film 16. Thereafter the wiring layer 18 connected to the upper surfaces of the via plugs 17*c*, 17*b* and 17*a* is formed while the wiring layer 68 is formed on the same layer as the wiring layer 18, thereby obtaining the structure shown in FIG. 28.

In the aforementioned method of fabricating the semiconductor device according to this embodiment, the conductive films 15*f*, 15*g* and 15*h* corresponding to the capacitor upper electrode are provided in the recess portions defined by the insulator film 15*b* corresponding to the capacitor dielectric film. Therefore, the height of the capacitor can be reduced while increasing the capacitance thereof as compared with the conventional capacitor. Consequently, the height of the wiring layer 65 formed as a dummy pattern corresponding to the capacitor can be reduced. Therefore, the quantity of the material forming the dummy pattern corresponding to the capacitor can be reduced.

Further, the contact area between the conductive film 15*a* forming the capacitor lower electrode and the insulator film 15*b* forming the capacitor dielectric film is larger than that of the conventional capacitor. In the method of fabricating the semiconductor device according to this embodiment, therefore, the electrostatic capacitance of the capacitor can be increased without increasing the size thereof in the direction parallel to the main surface of the semiconductor substrate 1.

Consequently, the method of fabricating the semiconductor device according to this embodiment can attain both of the effect capable of increasing the electrostatic capacitance of the capacitor and the effect capable of reducing the quantity of the material forming the dummy pattern corresponding to the capacitor without increasing the size of the capacitor in the direction parallel to the main surface of the semiconductor substrate 1.

According to this embodiment, the capacitor is formed similarly to the capacitor in the first embodiment. However, the aforementioned effects can be attained in this embodiment also when preparing the capacitor similarly to that in the second or third embodiment.

Fifth Embodiment

A semiconductor device according to a fifth embodiment of the present invention and a method of fabricating the same are described with reference to FIGS. 34 to 42.

Figure 34:
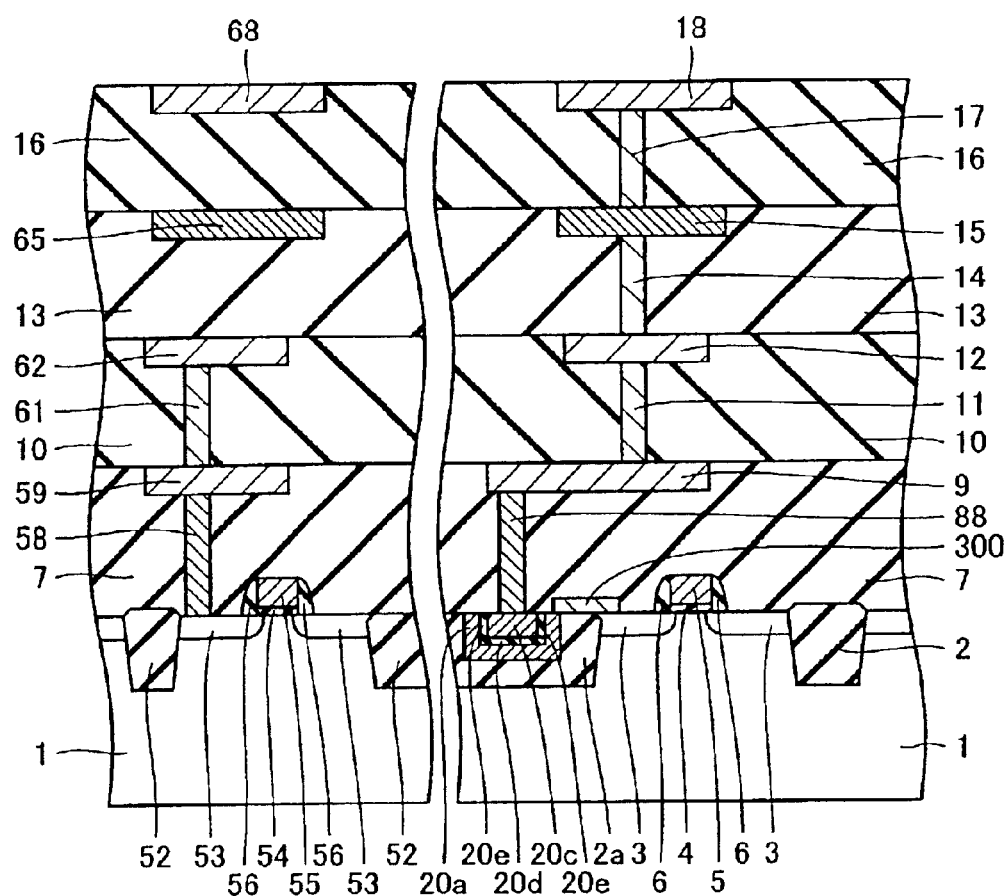
FIG. 34 is a sectional view showing the structure of a semiconductor device according to a fifth embodiment of the present invention.
Figure 35:
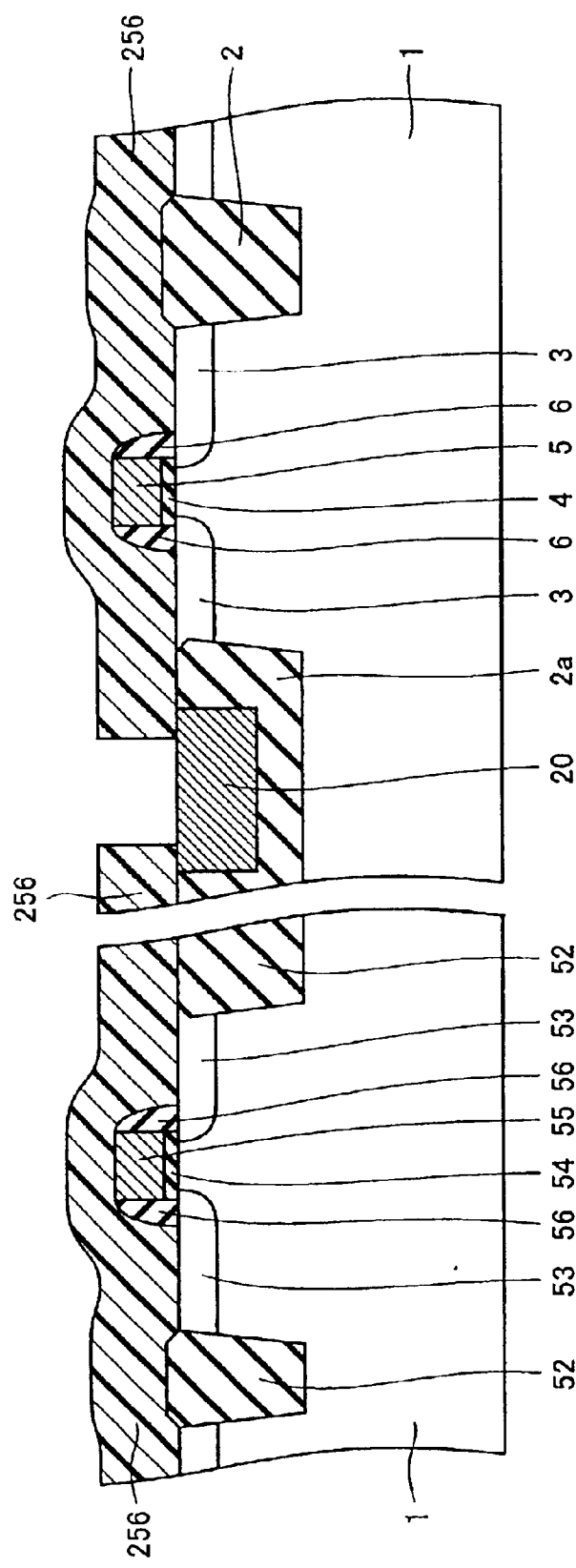
FIGS. 35 to 42 are diagrams for illustrating a method of fabricating the semiconductor device according to the fifth embodiment of the present invention.

The structure of the semiconductor device according to the fifth embodiment is now described with reference to FIG. 34. The structure of the semiconductor device according to this embodiment is similar to those of the semiconductor devices according to the first to fourth embodiments. However, the semiconductor device according to this embodiment is different from those according to the first to fourth embodiments in a point that no capacitor is formed in the vicinity of an upper portion of an interlayer dielectric film 13.

Therefore, both of a conductive film 15 and a wiring layer 65 formed in the vicinity of the upper portion of the interlayer dielectric film 13 have single-layer structures. In the structure of the semiconductor device according to this embodiment, therefore, the height of a dummy pattern can be reduced as compared with the conventional semiconductor device provided with the dummy pattern, corresponding to the capacitor, having a two-layer structure.

The semiconductor device according to this embodiment is further different from those according to the first to fourth embodiments in a point that a capacitor is embedded in a recess portion formed in an element isolation film 2a.

In the semiconductor device according to this embodiment, a conductive film 20a is formed along the surfaces of the recess portion formed in the element isolation film 2a. The conductive film 20a forms a capacitor lower electrode. Therefore, the capacitor lower electrode has portions extending perpendicularly to the main surface of a semiconductor substrate 1 and a portion extending in parallel with the main surface of the semiconductor substrate 1.

An insulator film 20d is formed along the bottom surface of a recess portion defined by the conductive film 20a. Two insulator films 20e are formed along two inner side surfaces of the recess portion defined by the conductive film 20a respectively. The insulator film 20d and the two insulator films 20e form a capacitor dielectric film.

A conductive film 20c is embedded in a recess portion defined by the insulator film 20d and the two insulator films 20e. This conductive film 20c forms a capacitor upper electrode. A wiring layer 300 is formed to be in contact with the upper surface of the conductive film 20c as well as the upper surface of one of source/drain regions 3. A via plug 88 is connected to the upper surface of the conductive film 20c forming the capacitor upper electrode. This via plug 88 is connected to a wiring layer 9.

The structure of the aforementioned semiconductor device according to this embodiment other than those of the characteristic parts is absolutely similar to those of the first to fourth embodiments described with reference to FIGS. 1, 11, 21 and 28.

In the semiconductor device according to this embodiment having the aforementioned structure, the capacitor is embedded in the element isolation film 2a. Therefore, no dummy pattern may be formed in correspondence to the capacitor. In other words, the upper surface of an interlayer dielectric film 16 can be flattened after CMP in a later step by simply providing the wiring layer 65 as a single-layer dummy pattern corresponding to the single wiring layer 15. Consequently, the quantity of a material forming a dummy pattern corresponding to the capacitor can be reduced.

Further, the capacitor dielectric film has the portions extending perpendicularly to the main surface of the semiconductor substrate 1 and the portion extending in parallel with the main surface of the semiconductor substrate 1. Therefore, the capacitance of the capacitor can be increased without increasing the sizes of the upper and lower electrodes thereof in the direction parallel to the main surface of the semiconductor substrate 1, similarly to the semiconductor devices according to the first to fourth embodiments.

Consequently, the semiconductor device according to this embodiment can attain both of the effect capable of increasing the electrostatic capacitance of the capacitor and the effect capable of reducing the quantity of the material forming the dummy pattern corresponding to the capacitor without increasing the size of the capacitor in the direction parallel to the main surface of the semiconductor substrate 1.

The method of fabricating the semiconductor device according to the fifth embodiment is described with reference to FIGS. 35 to 42. In the method of fabricating the semiconductor device according to the fifth embodiment, an element isolation film 2 for forming an element forming region is formed at a prescribed depth from the main surface of the semiconductor substrate 1.

Then, the source/drain regions 3 and source/drain regions 53 are formed in the element forming region at a prescribed depth from the main surface of the semiconductor substrate 1. A gate insulator film 4 is formed on an upper portion of a region held between the source/drain regions 3. A gate electrode 5 is formed on the gate insulator film 4. Side wall insulator films 6 are formed on the side walls of the gate insulator film 4 and the gate electrode 5.

Another gate insulator film 54 is formed on an upper portion of a region held between the source/drain regions 53. Side wall insulator films 56 are formed on the side walls of the gate insulator film 54 and a gate electrode 55.

A resist film 256 is formed to integrally cover the element isolation film 2, the source/drain regions 3 and 53, the side wall insulator films 6 and 56 and the gate electrodes 5 and 55. This resist film 256 is opened in a partial region located on the upper surface of a conductive film 20. Thereafter a portion of the element isolation film 2 exposed in the opening of the resist film 256 is etched thereby forming the element isolation film 2a. The conductive film 20 is embedded in the element isolation film 2a, thereby obtaining a structure shown in FIG. 35.

Figure 36:
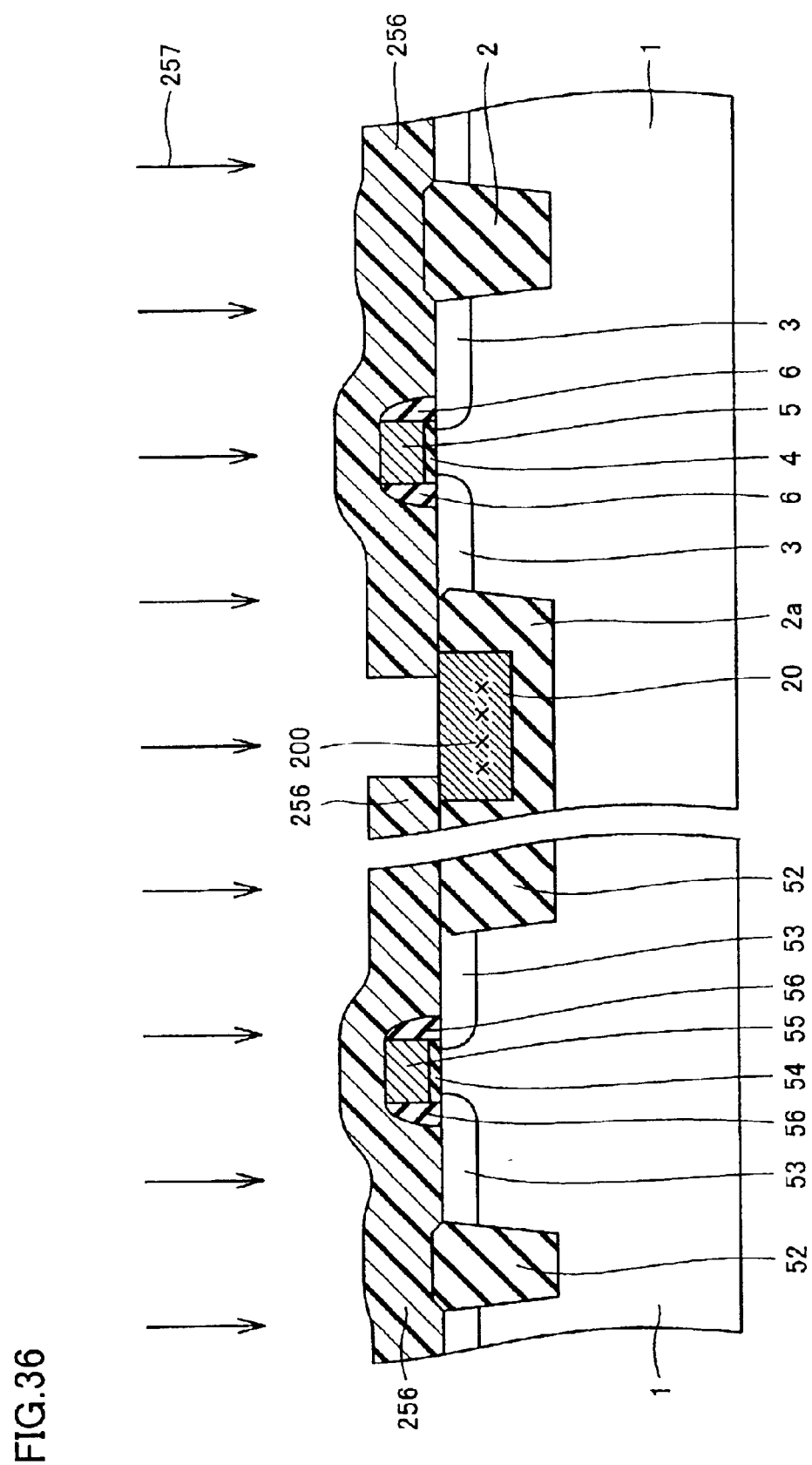

The resist film 256 is employed as a mask for ion-implanting oxygen ions 200 into the conductive film 20 along arrows shown in FIG. 36. The portion of the conductive film 20 where the oxygen ions 200 segregate is converted to a metal oxide film, a silicon oxide film or the like.

Figure 37:
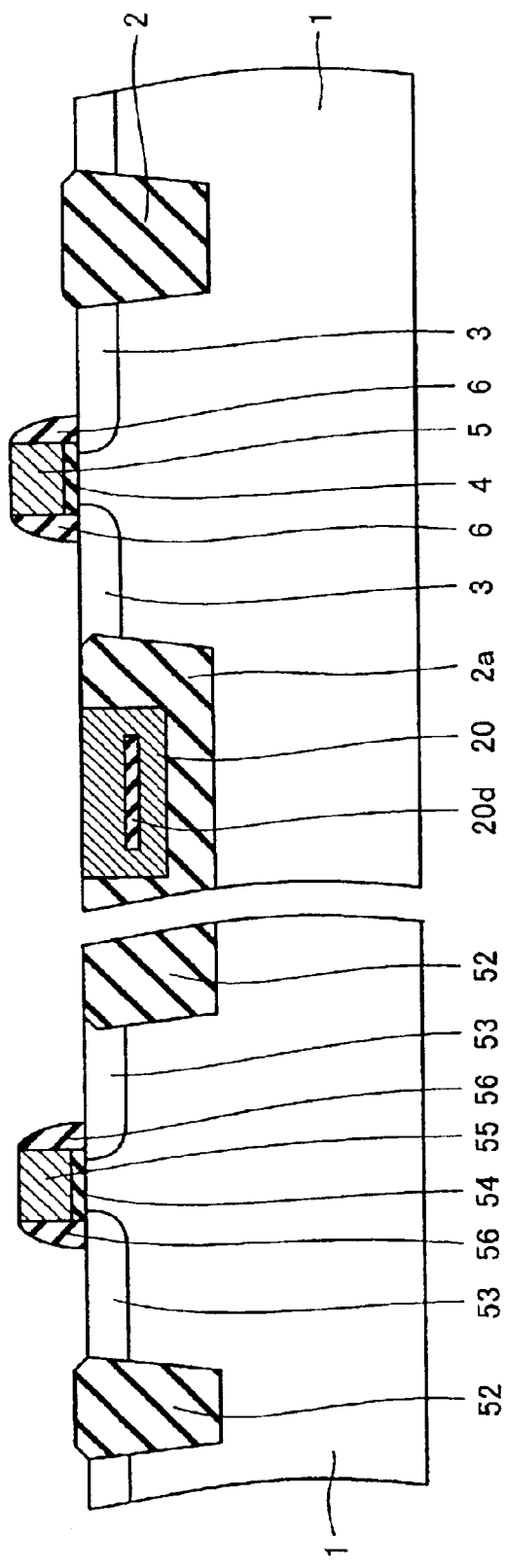

Then, the resist film 256 is removed. Thus, the insulator film 20d is formed in the conductive film 20, as shown in FIG. 37. The insulator film 20d is a film distinguishable from the conductive film 20. The conductive film 20 is formed by a metal film of copper or aluminum or a polycrystalline silicon film, for example.

The dose of and the implantation energy in the aforementioned ion implantation step are so adjusted that the peak of the concentration of the oxygen ions 200 is formed on a position (substantially central portion of the conductive film 20 in the vertical direction) of a prescribed depth from the main surface of the conductive film 20. Therefore, the insulator film 20d is formed to extend only on a position of the conductive film 20 at a prescribed depth from the main surface of the semiconductor substrate 1 after the ion implantation step, as shown in FIG. 37.

Figure 38:
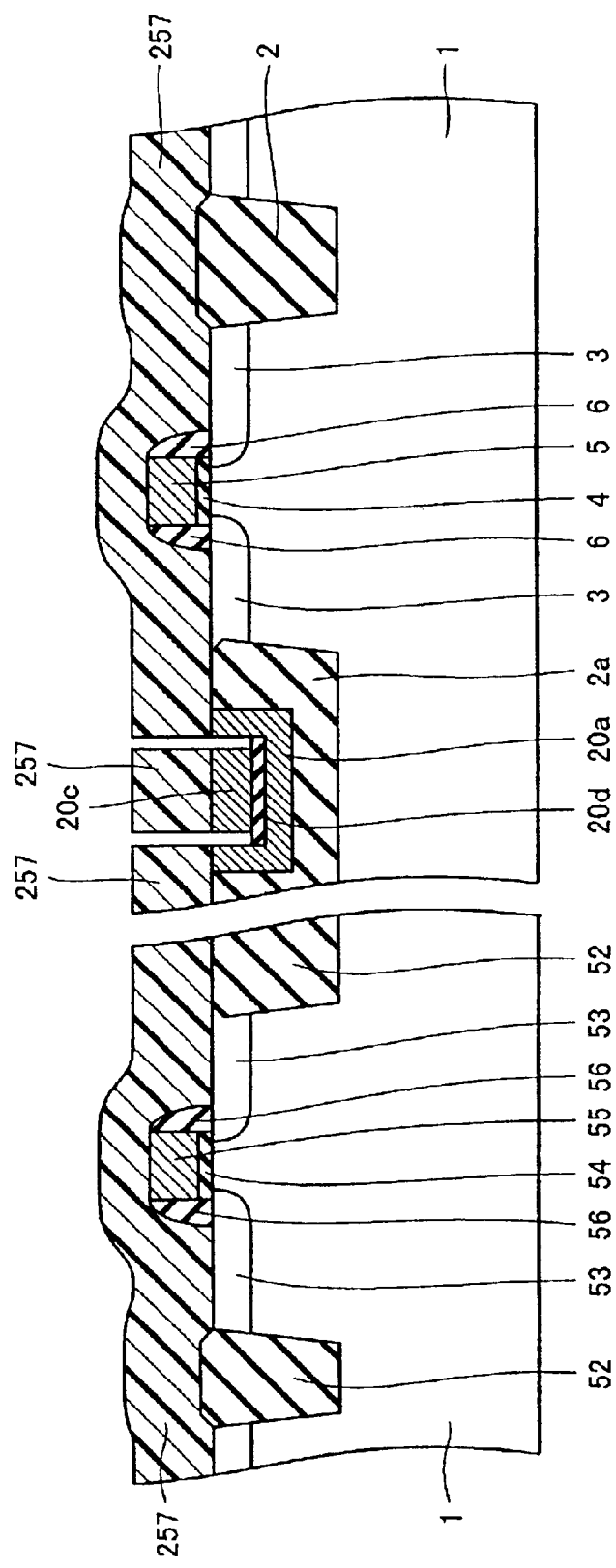

Then, a resist film 257 is formed to cover regions outside positions at prescribed distances from both ends of the conductive film 20 respectively, as shown in FIG. 38. The resist film 257 also covers a region inside positions at prescribed distances from both ends of the insulator film 20d respectively.

Figure 39:
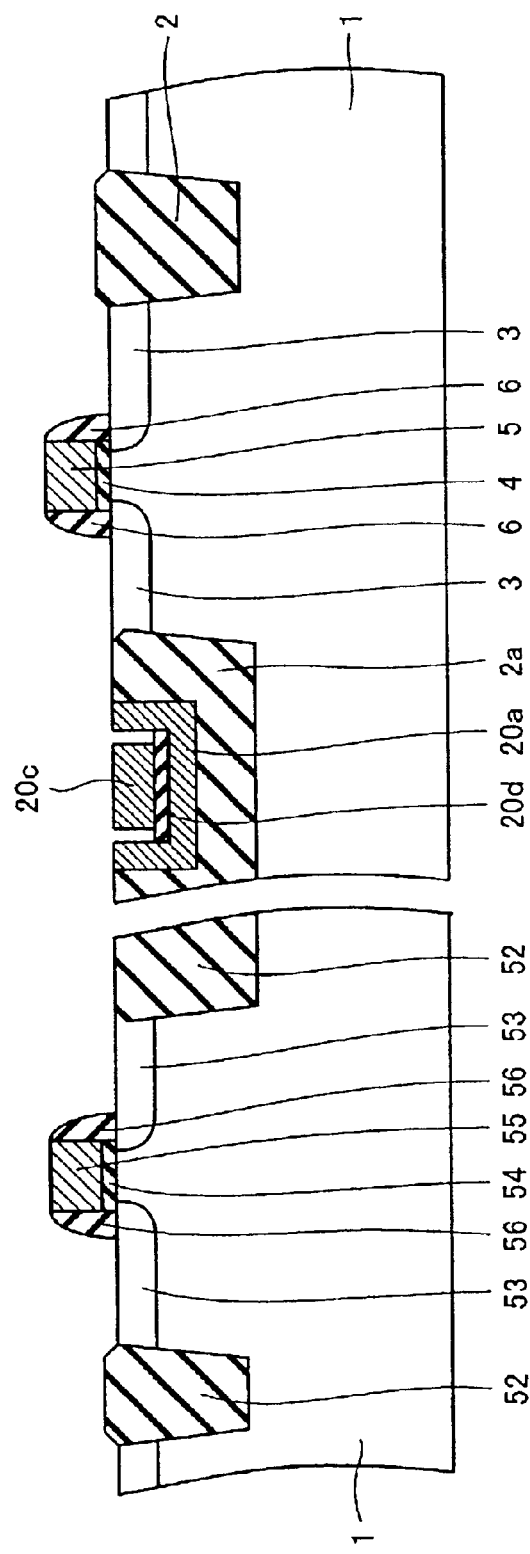

Thereafter the resist film 257 is employed as a mask for etching the conductive film 20 until the surface of the insulator film 20d is exposed. Thus, a structure shown in FIG. 39 is obtained. In other words, the conductive films 20a and 20c forming the capacitor lower electrode and the capacitor upper electrode respectively are formed.

Figure 40:
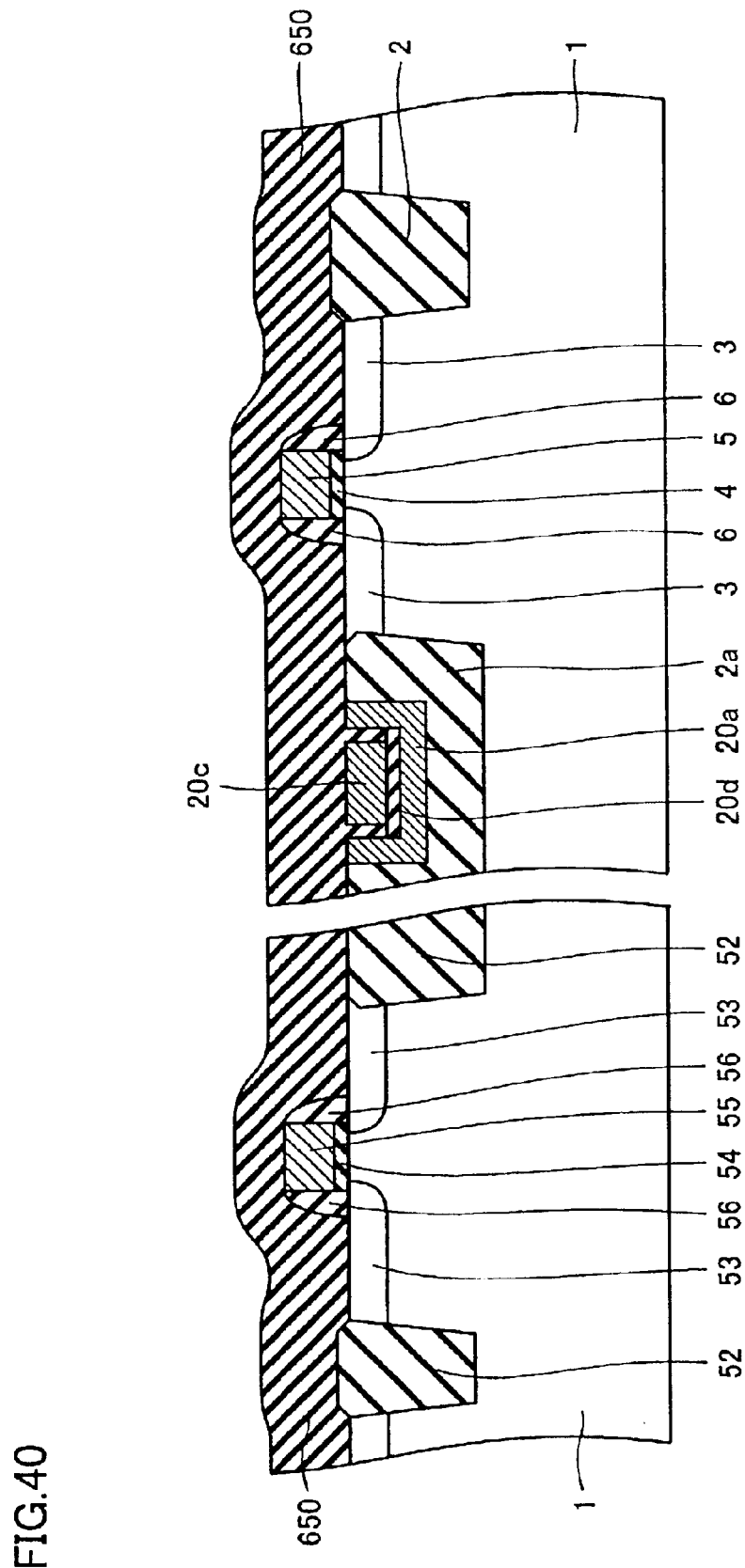

Then, an insulator film 650 is formed to integrally cover the main surface of the semiconductor substrate 1, as shown in FIG. 40. This insulator film 650 is formed to fill up a recess portion defined between the conductive films 20c and 20a.

Then, the insulator film 650 shown in FIG. 40 is etched back thereby exposing the upper surfaces of the gate electrodes 5 and 55 and the upper surfaces of the source/drain regions 3 and 53. Thus, a structure shown in FIG. 41 is obtained.

Figure 41:
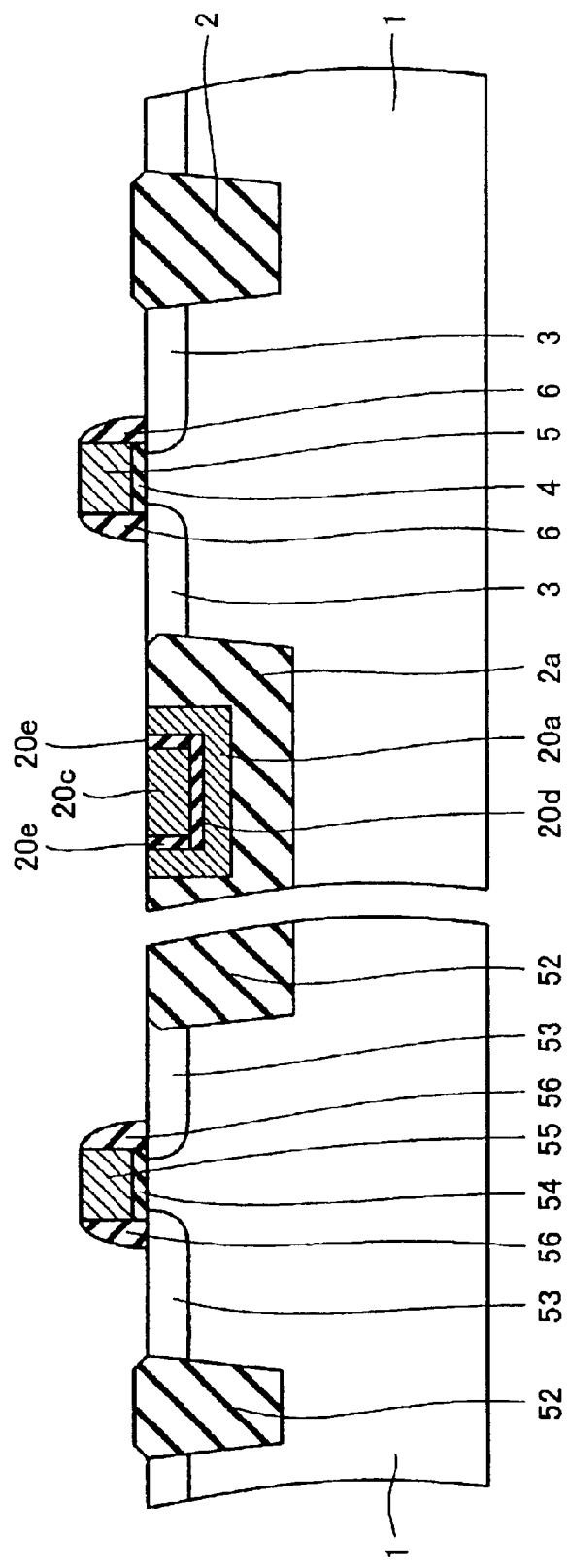

In the structure shown in FIG. 41, the two insulator films 20e are embedded between the conductive films 20a and 20c. The insulator film 20d and the two insulator films 20e form the capacitor dielectric film.

Figure 42:
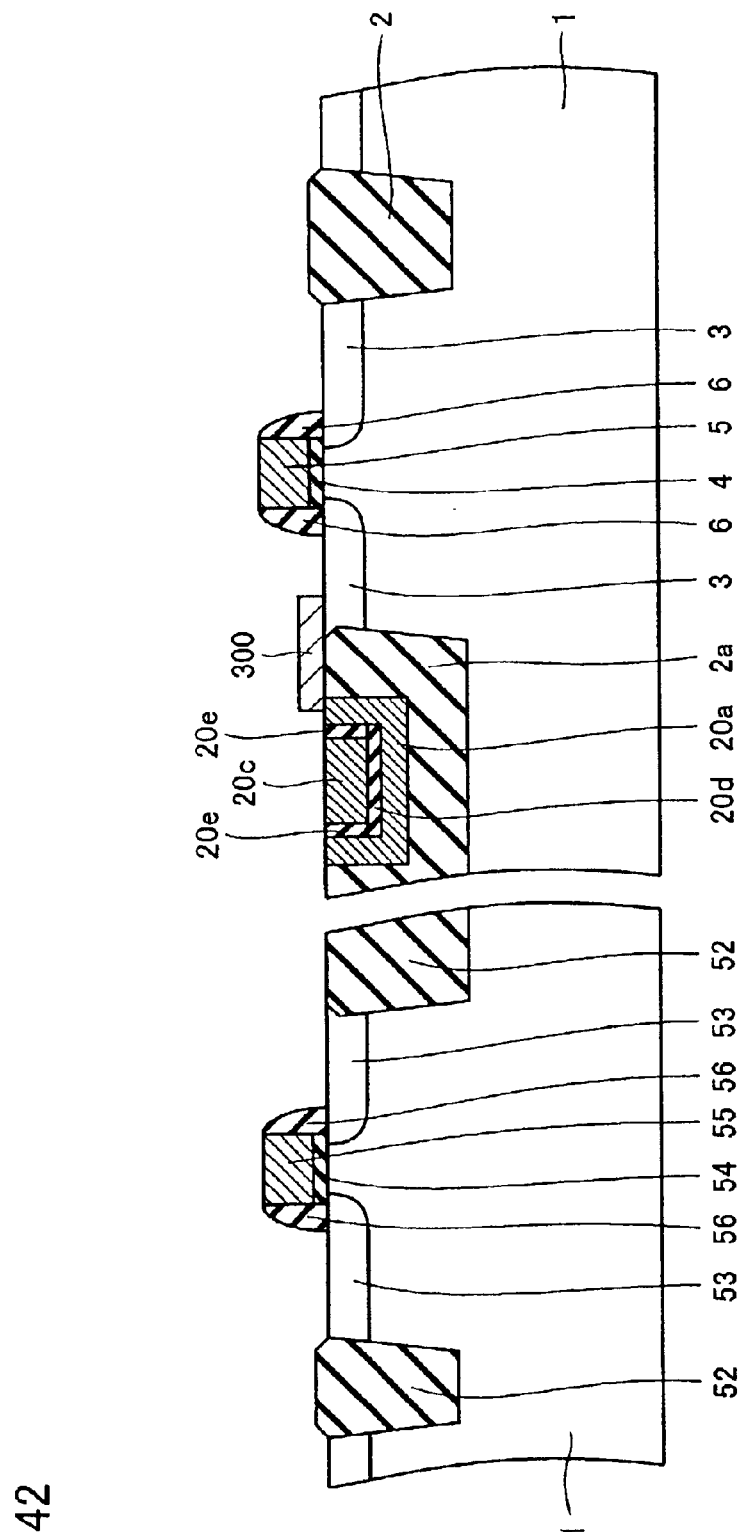

Then, a wiring layer 300 is formed to connect a part of the upper surface of the conductive film 20a with the upper surface of one of the source/drain regions 3, as shown in FIG. 42. This wiring layer 300 electrically connects the capacitor and a transistor with each other.

In the aforementioned method of fabricating the semiconductor device according to this embodiment, the conductive film 20a forming the capacitor lower electrode is formed to have the portion extending in parallel with the main surface of the semiconductor substrate 1 and the portions extending perpendicularly to the main surface of the semiconductor substrate 1. Therefore, the electrostatic capacitance of the capacitor can be increased without increasing the size of the capacitor in the direction parallel to the main surface of the semiconductor substrate 1.

In the aforementioned method of fabricating the semiconductor device according to this embodiment, further, the capacitor can be embedded in the element isolation film 2a. Therefore, no dummy pattern may be formed in correspondence to the capacitor. Thus, the upper surface of the interlayer dielectric film 16 can be flattened after CMP in the later step by simply providing the wiring layer 65 as a single-layer dummy pattern corresponding to the single wiring layer 15. Consequently, the quantity of a material forming a dummy pattern corresponding to the capacitor can be reduced.

As a result, the method of fabricating the semiconductor device according to this embodiment can attain both of the effect capable of increasing the electrostatic capacitance of the capacitor and the effect capable of reducing the quantity of the material forming the dummy pattern corresponding to the capacitor without increasing the size of the capacitor in the direction parallel to the main surface of the semiconductor substrate 1.

In the method of fabricating the semiconductor device according to this embodiment, the capacitor is formed similarly to the capacitor in the third embodiment. However, effects similar to the above can be attained in this embodiment also when forming the capacitor similarly to that in the first or second embodiment.

While the capacitor upper electrode is formed by a conductive film having an integral structure in this embodiment, a capacitor upper electrode divided into a plurality of portions may alternatively be employed similarly to the capacitor upper electrode in the fourth embodiment. Thus, the electrostatic capacitance of the capacitor can be further increased similarly to the semiconductor device according to the fourth embodiment.

In each of the aforementioned first to fifth embodiments, the capacitor upper electrode or the capacitor lower electrode is formed by a polycrystalline silicon film containing an impurity, a copper film, an aluminum film, a copper/aluminum alloy film or an alloy film of a copper/aluminum alloy and silicon.

The capacitor upper electrode or the capacitor lower electrode is formed by CVD (chemical vapor deposition), plating or sputtering.

The capacitor dielectric film is formed by a silicon oxide film, a silicon nitride film, a $Ta_2O_5$ (tantalum oxide) film or a BST (barium strontium titanate) film.

The capacitor in the semiconductor device according to each of the aforementioned first to fifth embodiments is an MIM (metal insulator metal) capacitor. The contact plug or the wiring layer is formed by a polycrystalline silicon film containing a metal such as tungsten or titanium and an impurity or the like. The interlayer dielectric film is formed by a silicon oxide film or a silicon nitride film deposited by CVD or sputtering.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate;

an interlayer dielectric film having an upper surface parallel to the main surface of said semiconductor substrate and including a first recess portion formed at a prescribed depth from said upper surface and a second recess portion formed at a prescribed depth from said upper surface;

a first conductive film, filling up said first recess portion, having an upper surface continuous with said upper surface;

a capacitor lower electrode provided along the surface of said second recess portion;

a capacitor dielectric film provided along the surface of a recess portion defined by said capacitor lower electrode; and a capacitor upper electrode provided in a recess portion defined by said capacitor dielectric film.

2. The semiconductor device according to claim 1, wherein an insulator film formed on the same layer as said capacitor dielectric film is provided to cover said upper surface of said first conductive film, and the height of the upper surface of said insulator film from the main surface of said semiconductor substrate is identical to the height of the upper surface of said capacitor upper electrode from the main surface of said semiconductor substrate.

3. The semiconductor device according to claim 1, wherein the height of said upper surface of said first conductive film from the m in surface of said semiconductor substrate is identical to the height of the upper surface of said capacitor upper electrode from the main surface of said semiconductor substrate.

4. The semiconductor device according to claim 1, wherein said recess portion defined by said capacitor lower electrode is formed by etching a prescribed conductive film.

5. The semiconductor device according to claim 1, wherein said first conductive film has a two-layer structure formed by a lower conductive film and an upper conductive film, and said capacitor lower electrode has a bottom surface portion and a side surface portion, said bottom surface portion is formed on the same layer as said lower conductive film, and said side surface portion is formed on the same layer as said upper conductive film.

6. The semiconductor device according to claim 1, wherein said recess portion defined by said capacitor lower electrode is formed by a plurality of trench portions, said capacitor dielectric film is provided along the respective surfaces of said plurality of trench portions, and said capacitor upper electrode is divided into a plurality of portions provided inside a plurality of recess portions defined by said capacitor dielectric film respectively.

7. A semiconductor device comprising:

an element forming region, formed on a semiconductor substrate, provided with a transistor;

an element isolation film, formed in the semiconductor substrate and enclosing said element forming region, having a recess portion formed at a prescribed depth from an upper surface; and a capacitor provided in said recess portion and electrically connected to source/drain region of said transistor.

8. A semiconductor device comprising:

an element forming region, formed on a semiconductor substrate, provided with a transistor;

an element isolation film, enclosing said element forming region, having a recess portion formed at a prescribed depth from the upper surface; and a capacitor provided in said recess portion and electrically connected to source/drain region of said transistor, wherein said capacitor includes:

a capacitor lower electrode formed along the surface of said recess portion, a capacitor dielectric film provided along the surface of a recess portion defined by said capacitor lower electrode, and a capacitor upper electrode provided in a recess portion defined by said capacitor dielectric film, said semiconductor device further comprising a wiring layer electrically connecting said capacitor lower electrode and said source/drain region with each other.

* * * * *